(12) United States Patent
Basker et al.

(10) Patent No.: US 10,504,786 B2
(45) Date of Patent: Dec. 10, 2019

(54) SEMICONDUCTOR FINS FOR FINFET DEVICES AND SIDEWALL IMAGE TRANSFER (SIT) PROCESSES FOR MANUFACTURING THE SAME

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/463,972

(22) Filed: Mar. 20, 2017

(65) Prior Publication Data

US 2017/0194462 A1 Jul. 6, 2017

Related U.S. Application Data

(62) Division of application No. 14/739,008, filed on Jun. 15, 2015, now Pat. No. 9,601,378.

(51) Int. Cl.
*H01L 21/8234* (2006.01)
*H01L 21/84* (2006.01)
(Continued)

(52) U.S. Cl.
CPC ........... *H01L 21/823431* (2013.01); *H01L 21/02236* (2013.01); *H01L 21/02532* (2013.01);
(Continued)

(58) Field of Classification Search
None
See application file for complete search history.

(56) References Cited

U.S. PATENT DOCUMENTS

| 7,074,662 | B2 | 7/2006 | Lee et al. |
| 7,993,999 | B2 | 8/2011 | Basker et al. |

(Continued)

OTHER PUBLICATIONS

List of IBM Patents or Patent Applications Treated as Related dated Mar. 20, 2017 2 pages.

(Continued)

*Primary Examiner* — Reema Patel
*Assistant Examiner* — Steven Christopher
(74) *Attorney, Agent, or Firm* — Scully, Scott, Murphy & Presser, P.C.; Steven J. Meyers

(57) ABSTRACT

A method of forming a semiconductor structure includes providing a semiconductor substrate, forming at least one precursor semiconductor fin from the semiconductor substrate, etching through at least a portion of the at least one precursor semiconductor fin to form at least one patterned precursor semiconductor fin having a gap therein. The at least one patterned precursor semiconductor fin includes a first vertical surface and a second vertical surface with the gap therebetween. In addition, the method further includes forming a semiconductor material in the gap of the at least one patterned precursor semiconductor fin, in which the first vertical surface and the second vertical surface laterally surround the semiconductor material, and transforming the at least one patterned precursor semiconductor fin into at least one semiconductor fin including the semiconductor material therein.

12 Claims, 16 Drawing Sheets

(51) Int. Cl.
| | |
|---|---|
| *H01L 21/306* | (2006.01) |
| *H01L 21/308* | (2006.01) |
| *H01L 21/02* | (2006.01) |
| *H01L 21/324* | (2006.01) |
| *H01L 29/78* | (2006.01) |
| *H01L 29/161* | (2006.01) |
| *H01L 29/10* | (2006.01) |
| *H01L 29/66* | (2006.01) |
| *H01L 27/12* | (2006.01) |
| *H01L 29/36* | (2006.01) |
| *H01L 27/088* | (2006.01) |

(52) U.S. Cl.
CPC .. *H01L 21/02636* (2013.01); *H01L 21/02645* (2013.01); *H01L 21/308* (2013.01); *H01L 21/3081* (2013.01); *H01L 21/3086* (2013.01); *H01L 21/30604* (2013.01); *H01L 21/324* (2013.01); *H01L 21/823412* (2013.01); *H01L 21/845* (2013.01); *H01L 27/0886* (2013.01); *H01L 27/1211* (2013.01); *H01L 29/1037* (2013.01); *H01L 29/161* (2013.01); *H01L 29/36* (2013.01); *H01L 29/6656* (2013.01); *H01L 29/66795* (2013.01); *H01L 29/785* (2013.01); *H01L 29/7851* (2013.01); *H01L 21/02255* (2013.01)

(56) References Cited

U.S. PATENT DOCUMENTS

| | | | |
|---|---|---|---|
| 8,497,177 B1* | 7/2013 | Chang | H01L 29/66795 438/283 |
| 8,703,556 B2 | 4/2014 | Kelly et al. | |
| 8,975,129 B1* | 3/2015 | Shieh | H01L 21/3086 438/199 |
| 2013/0234204 A1 | 9/2013 | Kang et al. | |
| 2013/0244392 A1* | 9/2013 | Oh et al. | H01L 29/66477 438/299 |
| 2014/0197456 A1 | 7/2014 | Wang et al. | |
| 2014/0339643 A1 | 11/2014 | Cheng et al. | |
| 2015/0295089 A1 | 10/2015 | Huang et al. | |
| 2015/0325692 A1 | 11/2015 | Zang | |
| 2015/0364603 A1* | 12/2015 | Cheng | H01L 29/7851 257/192 |
| 2016/0093697 A1* | 3/2016 | Bergendahl | H01L 29/7851 257/14 |
| 2016/0336187 A1* | 11/2016 | Liou | H01L 21/3086 |
| 2016/0351411 A1 | 12/2016 | Xie et al. | |

OTHER PUBLICATIONS

Notice of Allowance dated Mar. 28, 2018 received in U.S. Appl. No. 15/464,028.

Notice of Allowance dated Jul. 13, 2018 received in U.S. Appl. No. 15/464,007, Copy Not Enclosed.

* cited by examiner

SEMICONDUCTOR FINS FOR FINFET DEVICES AND SIDEWALL IMAGE TRANSFER (SIT) PROCESSES FOR MANUFACTURING THE SAME

BACKGROUND

The present application relates to semiconductor fins for FinFET devices, and particularly to semiconductor fins for FinFET devices and sidewall image transfer (SIT) processes for manufacturing the same.

FinFET devices are widely used in the semiconductor industry. However, there may be difficulties associated with the manufacture of the semiconductor fins for the FinFET devices.

For instance, high atomic percentage germanium (Ge) channels are currently being proposed as channel materials for future nodes. However, with conventional methods, it is almost impossible to form stable high atomic % germanium films without significant physical/damage occurring to these high atomic % germanium films caused by wet etching processes and/or dry etching processes (e.g., RIE) when taking these films downstream.

In addition, another difficulty with manufacturing semiconductor fins for FinFET devices is that a tight fin pitch may be needed for continued scaling of FinFET to 7 nm nodes and beyond. However, 7 nm nodes calls for 28 nm fin pitch which is well beyond conventional lithography patterning and even conventional sidewall transfer image (SIT) techniques. Currently, double SIT (SIT2) is being used in an attempt to form semiconductor fins with a tight pitch for a 7 nm node. SIT2 basically repeats the conventional SIT process. However, since conventional SIT2 processes form mandrels on different levels of a wafer from one another there may be certain drawbacks associated with these conventional processes. For instance, one the drawbacks to using conventional SIT2 processes is that it increases manufacturing costs. In addition, another drawback to conventional SIT2 processes is the difficulty in cutting (removing) the unwanted semiconductor fins after SIT2 due to the tight fin pitch (semiconductor fins are closely spaced and therefore it is difficult to completely cut the unwanted fin without compromising the adjacent device semiconductor fins).

SUMMARY

In accordance with an exemplary embodiment of the present application, a method of forming a semiconductor structure is provided. The method includes providing a semiconductor substrate, forming at least one precursor semiconductor fin from the semiconductor substrate, etching through at least a portion of the at least one precursor semiconductor fin to form at least one patterned precursor semiconductor fin having a gap therein. The at least one patterned precursor semiconductor fin includes a first vertical surface and a second vertical surface with the gap therebetween. In addition, the method further includes forming a semiconductor material in the gap of the at least one patterned precursor semiconductor fin, in which the first vertical surface and the second vertical surface laterally surround the semiconductor material, and transforming the at least one patterned precursor semiconductor fin into at least one semiconductor fin including the semiconductor material therein.

In accordance with an exemplary embodiment of the present application, a semiconductor structure is provided. The semiconductor structure includes a semiconductor substrate, and at least one fin disposed on the semiconductor substrate. The at least one semiconductor fin includes an inner core comprising silicon germanium (SiGe) material having a germanium content of from 10 atomic % to 90 atomic % therein, and an outer shell laterally surrounding the inner core of the at least one semiconductor fin. The outer shell includes one of Si or SiGe having a germanium content of no greater than 10 atomic %.

In accordance with an exemplary embodiment of the present application, a method for forming a semiconductor structure is provided. The method includes providing a semiconductor substrate, forming at least one mandrel on the semiconductor substrate and forming a first sidewall image transfer (SIT) spacer on sidewalls of the at least one mandrel. The method further includes forming a mandrel SIT spacer on sidewalls of the first SIT spacer and forming a second SIT spacer on sidewalls of the mandrel SIT spacer. Further, the method includes removing the at least one mandrel and the mandrel SIT spacers from the sidewalls of the first SIT, thereby defining a pattern comprising the first SIT spacers and the second SIT spacers on the semiconductor substrate. In addition, the method further includes etching the semiconductor substrate using the first SIT spacers and the second SIT spacers as an etching mask to transfer the pattern of the first SIT spacers and the second SIT spacers into the semiconductor substrate to form a plurality of semiconductor fins from the semiconductor substrate.

DETAILED DESCRIPTION

Figure 1:
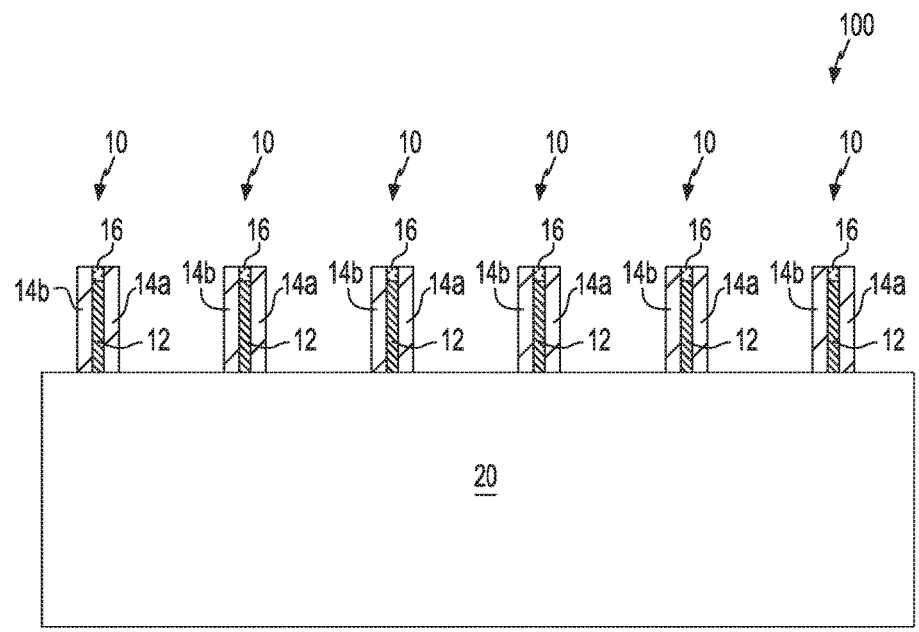
FIG. 1 is a vertical cross-sectional view of a semiconductor structure including a plurality of semiconductor fins according to a first embodiment of the present application.

Referring first to FIG. 1, there is shown a semiconductor structure 100 in accordance with a first embodiment of the present application.

The semiconductor structure 100 may be an intermediate stage in the manufacture of a FinFET device. The semiconductor structure 100 includes a plurality of semiconductor fins 10 spaced apart from each other on an insulator layer 20 (e.g., BOX) of an SOI substrate 1 (See SOI substrate 1 in FIG. 2). The semiconductor fins 10 in this embodiment are formed by patterning a top semiconductor layer 30 of the SOI substrate 1 as explained in further detail hereinafter in connection with the fabrication method illustrated and described in FIGS. 2-9. Alternatively, and in other embodiments, the plurality of semiconductor fins 10 may be formed from a bulk semiconductor substrate instead of from the SOI substrate 1.

In addition, and in other embodiments, the SOI substrate 1 may further include a handle substrate (not shown). The handle substrate may comprise, for example, a semiconductor material. The semiconductor material of the handle substrate can include, but is not limited to, silicon (Si), germanium (Ge), silicon germanium (SiGe), silicon germanium carbide (SiGeC), silicon carbide (SiC), an III-V compound semiconductor, an II-VI compound semiconductor or any combinations thereof. Multilayers of semiconductor materials can also be used as the semiconductor material of the handle substrate. In one embodiment, the handle substrate is comprised of silicon. In some embodiments, the handle substrate is a non-semiconductor material including, for example, a dielectric material and/or a conductive material.

The semiconductor fins 10 each include an inner core 12 located inside the semiconductor fins 10 and an outer shell 14a, 14b (formed by etching the top semiconductor layer 30 of the SOI substrate 1) which surrounds the inner core 12 of the semiconductor fins 10. The semiconductor fins 10 may have a width in the range of, for example, 4 nm-16 nm. The inner core 12 may include a semiconductor material which is formed by, for example, a selective epitixal growth (SEG) process performed within a patterned precursor semiconductor fin 18 as described in further detail in connection with FIGS. 2-9. The inner core 12 may include a semiconductor material including but not limited to, for example, silicon germanium (SiGe), germanium (Ge), an III-V compound semiconductor or any combinations thereof. Also, the inner core 12 of the semiconductor fins 10 may have a width in the range of, for example, 2 nm-12 nm.

The outer shell 14a, 14b of the semiconductor fins 10 which surrounds the inner core 12 of the semiconductor fins 10 may include a semiconductor material which is capable of protecting the semiconductor material in the inner core 12 of the semiconductor fins 10 from any attack thereon during downstream processes (e.g. wet etching or reactive ion etching (RIE)). For example, in some embodiments, the outer shell 14a, 14b may include Si or SiGe with a low percentage of germanium (i.e., 10 atomic % or less of germanium). The width of the outer shell 14a, 14b of the semiconductor fins 10 may be the range of, for example, 2 nm-6 nm.

In the present embodiment, the inner core 12 of the semiconductor fins 10 include silicon germanium (SiGe) with Ge present in an amount from 10 atomic % to 90 atomic %. In some embodiment, the inner core 12 of the semiconductor fins 10 include SiGe with Ge in a high percentage amount (i.e., 50 atomic %-90 atomic % of germanium). In other embodiments, the inner core 12 of the semiconductor fins 10 include SiGe with Ge present in an amount from 20 atomic % to 90 atomic %. In some embodiments, the outer shell 14a, 14b of the semiconductor fins 10 include silicon (Si) or silicon germanium with a low percentage of germanium (i.e., 10 atomic % or less of Ge). In the present embodiment, the outer shell 14a, 14b includes silicon.

In addition, the semiconductor fins 10 further include a cap 16 located on the upper surface of the semiconductor material that provides the inner core 12. In the present embodiment, the cap 16 includes silicon, and has an upper surface which is co-planar with an upper surface of the outer shell 14a, 14b of the semiconductor fins 10. In other embodiments, the cap 16 can alternatively include SiGe with a low percentage of Ge (i.e., 10 atomic % or less of Ge). Moreover, the width of the cap 16 may be in the range of, for example, 2 nm-8 nm. In other embodiments, the cap 16 may be omitted.

Reference is now made to FIGS. 2-7, which illustrate a method for fabricating the semiconductor structure 100 shown in FIG. 1 according to the first embodiment of the present application. Specifically, and referring to FIG. 2, an SOI substrate 1 is first provided but exemplary embodiments are not limited thereto. Alternatively, in other embodiments, a bulk semiconductor substrate may be provided instead of the SOI substrate 1 to form the semiconductor fins 10.

In the present embodiment, the SOI substrate 1 includes, for example, the insulator layer 20 (e.g., BOX) and the top semiconductor layer 30 contacting the top surface of the insulator layer 20. In other embodiments, the SOI substrate 1 may optionally further include a handle substrate (not shown) disposed below the insulator layer 20.

The SOI substrate 1 may be fabricated using techniques well known to those skilled in the art. For example, the SOI substrate 1 may be formed by conventional processes including, but not limited to, Separation by Implanted Oxygen (SIMOX) process, which employs high dose ion implantation of oxygen and high temperature annealing to form insulator layer 20 (e.g., BOX layer) in a bulk wafer, or wafer bonding. The SOI substrate 1 may also be formed using other processes. The method of fabricating the SOI substrate 1 is not critical to the present application.

The top semiconductor layer 30 may include any semiconductor material. In one embodiment, the semiconductor material that provides the top semiconductor layer 30 can be, for example, silicon. In another embodiment, the semiconductor material that provides the top semiconductor layer 30 can be, for example, silicon germanium (SiGe) with a low concentration of germanium (e.g. 10 atomic % or less of germanium).

The insulator layer 20 of the SOI substrate 1 may include a dielectric material such as, for example, silicon dioxide, silicon nitride, boron nitride or any other suitable insulating materials or combinations thereof. In an embodiment, the insulator layer 20 may be, for example, a buried oxide layer (BOX). The insulator layer 20 may, or may not, include multiple dielectric layers, e.g., a stack including at least a silicon dioxide layer and a silicon nitride layer.

Next, a dielectric layer (e.g., hard mask layer) 40 is deposited onto the top semiconductor layer 30 of the SOI substrate 1 using a deposition process such as, for example, chemical vapor deposition (CVD), atomic layer deposition (ALD), physical vapor deposition (PVD), evaporation, or spin-coating. The hard mask layer 40 may include, for example, a dielectric material such as, for example, an oxide or a nitride. In the present embodiment, the hard mask layer 40 includes silicon nitride. Alternatively, and in other embodiments, the hard mask layer 40 includes silicon dioxide. Moreover, in some embodiments, the formation of the hard mask layer 40 may be omitted.

Figure 2:
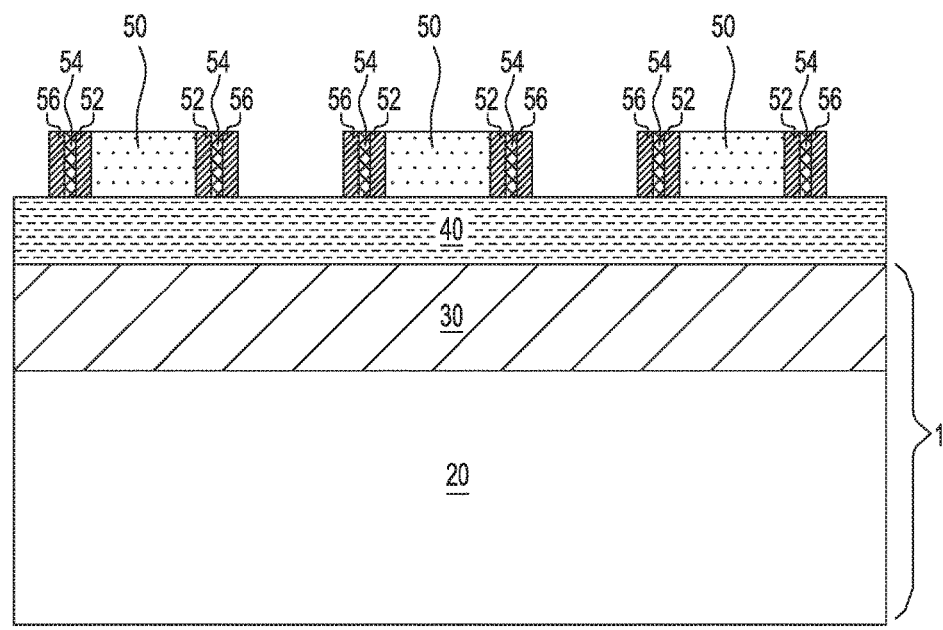
FIG. 2 is a vertical cross-sectional view of an exemplary semiconductor structure including a silicon-on-insulator (SOI) substrate, a hard mask layer disposed on the SOI substrate, a plurality of mandrels disposed on hard mask layer, and a first sidewall image transfer (SIT) spacer, a sacrificial SIT spacer and a second SIT spacer sequentially formed on sidewalls of the mandrels according to the first embodiment.

Next, a mandrel layer (not shown) is formed on the hard mask layer 40 using a deposition process such as, for example, atomic layer deposition (ALD) or chemical vapor deposition (CVD). The mandrel layer may include, for example, polycrystalline silicon (polysilicon), amorphous silicon, amorphous carbon, or other suitable material. The mandrel layer is then subsequently patterned and etched using, for example, conventional lithography and etching processes to form a plurality of mandrels 50 on the hard mask layer 40, as shown in FIG. 2. The mandrels 50 can each have a width in the range of, for example, 15 nm-40 nm.

A conformal deposition process is then performed to form a first spacer material (not shown) on the top surface of the mandrels 50, the sides of the mandrels 50, and on exposed surfaces of the hardmask layer 40. In one embodiment, the first spacer material comprises an oxide, but other materials are applicable as well. For example, and in another embodiment, the first spacer material may include a nitride. In an embodiment where the hard mask layer 40 includes a nitride, then the first spacer material should be an oxide. Alternatively, and in embodiments in which the hard mask layer 40 includes an oxide, then the first spacer material should include a nitride. Further, the first spacer material is etched using a sidewall image transfer (SIT) spacer formation etch process. The SIT spacer formation etch process includes, for example, a direction reactive ion etch (RIE) which removes the first spacer material from the top surfaces of the mandrels 50 and from the upper surfaces of the hard mask layer 40. As a result of the above RIE process, the first spacer material remains intact only on the sides of the mandrels 50. This first spacer material on the sides of the mandrels 50 is referred to hereinafter as first SIT spacer 52.

In addition, another conformal deposition process is then performed to form a sacrificial spacer material (not shown) on the exposed top surfaces the mandrels 50 and on the first SIT spacers 52 located on the sides of the mandrels 50, and also on exposed surfaces of the hardmask layer 40. In one embodiment, the sacrificial spacer material comprises a nitride such as, for example, titanium nitride (TiN), but other materials are applicable as well. For example, and in another embodiment, the sacrificial spacer material may include amorphous silicon or amorphous carbon. Further, the sacrificial spacer material is etched using the SIT spacer formation etch process mentioned above. The SIT spacer formation etch process removes the sacrificial spacer material from the top surfaces of the mandrels and from the upper surfaces of the hard mask layer 40. As a result of the above RIE process, the sacrificial spacer material remains intact only on the sides of the first SIT spacers 52. This sacrificial spacer material on the sides of the first SIT spacers 52 is referred to hereinafter as the sacrificial SIT spacer 54.

Moreover, another conformal deposition process is then performed to form a second spacer material (not shown) on the exposed top surface of the mandrels 50, on the sacrificial SIT spacer 54 located on the sides of the first SIT spacer 52, and also on exposed surfaces of the hardmask layer 40. In one embodiment, the second spacer material includes, for example, an oxide, but other materials are applicable as well. For example, and in another embodiment, the second spacer material may include a nitride. In embodiments in which the hard mask layer 40 includes a nitride, then the second spacer material should then be an oxide. Alternatively, and in embodiments in which the hard mask layer 40 includes an oxide, then the second spacer material should include a nitride.

Further, the second spacer material is etched using an SIT spacer formation etch process as mentioned above. The SIT spacer etch process removes the second spacer material from the top surfaces of the mandrels 50 and from the upper surfaces of the hard mask layer 40. As a result of the RIE process, the second spacer material remains intact only on the sides of the sacrificial SIT spacer 54. This second spacer material on the sides of the sacrificial SIT spacer 54 is referred to hereinafter as a second SIT spacer 56.

In the present embodiment, the first SIT spacer 52, the sacrificial SIT spacer 54 and the second SIT spacer 56 are sequentially disposed on the sides of each of the mandrels 50. In addition, and in the present embodiment, the upper surfaces of the first SIT spacer 52, the sacrificial SIT spacer 54 and the second SIT spacer 56 are all coplanar with each other, and the lower surfaces of the first SIT spacer 52, the sacrificial SIT spacer 54 and the second SIT spacer 56 are all coplanar with each other.

Figure 3:
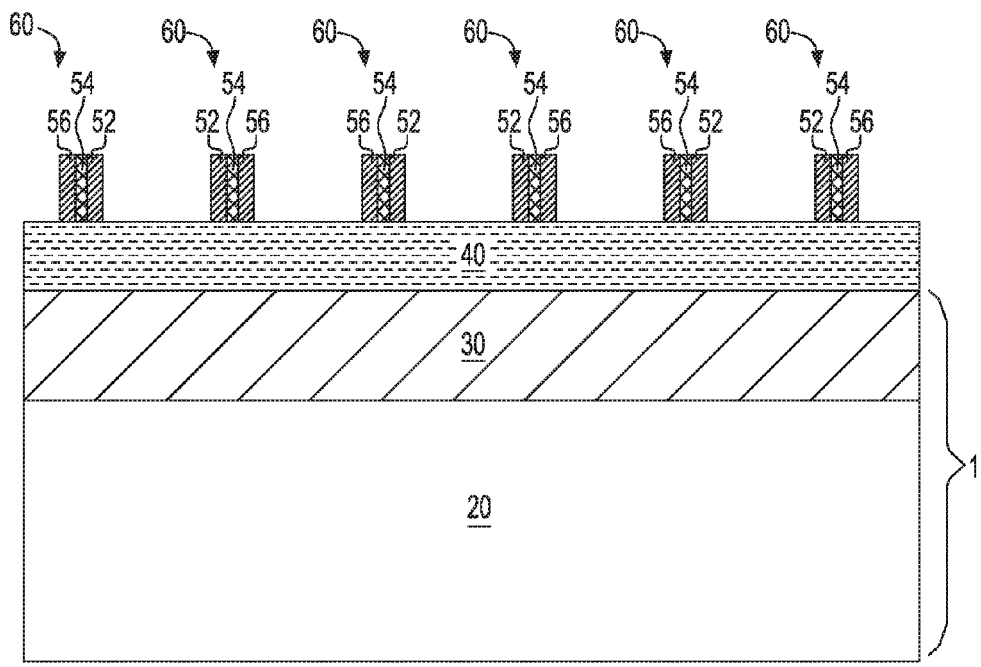
FIG. 3 is a vertical cross-sectional view of the exemplary semiconductor structure of FIG. 2 after removing the mandrels to form triple SIT spacer composite structures on the hard mask layer.

Next, as shown in FIG. 3, the mandrels 50 are then removed selective to the first SIT spacer 52, the second SIT spacer 56 and the sacrificial SIT spacer 54 using, for example, an anisotrophic dry etch and/or wet etching process leaving a plurality of triple SIT spacer composite structures 60 located on the top surface of the hard mask layer 40. The triple SIT spacer composite structures 60 each include one of the first SIT spacers 52, one of the second SIT spacers 56 and one of the sacrificial SIT spacers 54 that is located in between the first SIT spacer 52 and the second SIT spacer 56. The wet etching process may include, example, a tetramethylammonium (TMA) etch, a tetraethylammonium (TEA) etch, an ammonium hydroxide etch or an etch using hydrogen bromide (HBr) chemistry.

Further, as shown in FIG. 3, a pattern of the plurality of triple SIT spacer composite structures 60 is revealed as a result of the above removal of the mandrels 50. Following removal of the mandrels 50, the triple SIT spacer composite structures 60 are then used to transfer the pattern to the hardmask layer 40 and the top semiconductor layer 30 of the SOI substrate 1. In the present exemplary embodiment, the pattern of the triple SIT spacer composite structures 60 is first transferred to the hardmask layer 40, thereby forming the patterned hardmasks 41. (See, e.g., FIG. 4). This step may be carried out using an anisotropic etching process such as, for example, a RIE process. The patterned hardmasks 41 can then be used to pattern the top semiconductor layer 30 of the SOI substrate 1. Again, for example, a RIE process may be used to pattern the top semiconductor layer 30 of the SOI substrate 1. The particular etch chemistry used can be varied for etching selectivity between the hardmask layer 40 and the top semiconductor layer 30. Alternatively, as provided above, the use of a hardmask layer 40 in this process flow is optional. Thus, in the instance where a hardmask layer 40 is not employed, the pattern of the triple SIT spacer composite structures 60 is at this step transferred directly into the top semiconductor layer 30. (e.g., using RIE).

Figure 4:
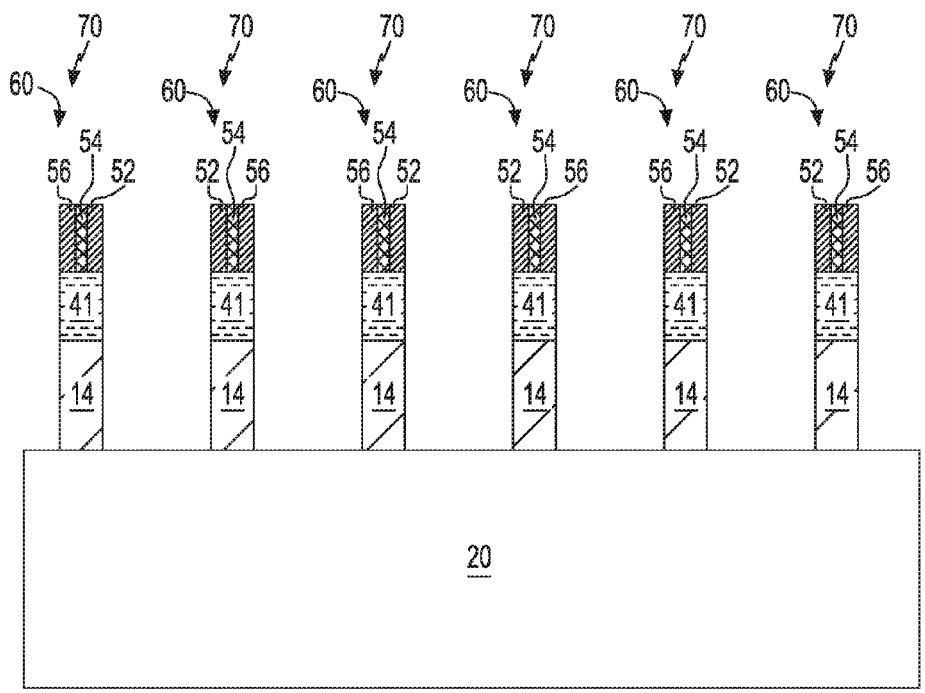
FIG. 4 is a vertical cross-sectional view of the exemplary semiconductor structure of FIG. 3 after etching the hard mask layer and a top semiconductor layer of the SOI substrate to form a plurality of precursor semiconductor fin structures each including a sequential stack of a precursor semiconductor fin, a hard mask layer pattern and one of the triple SIT spacer composite structures.

In the present embodiment, and as shown in FIG. 4, the result of the above patterning of the hard mask layer 40 and the top semiconductor layer 30 using the triple SIT spacer composite structures 60 as an etch mask results in the formation of a plurality of precursor semiconductor fin structures 70 located on the top surface of insulator layer 20 of the SOI substrate 1. The plurality of precursor semiconductor fin structures 70 each include a sequential stack of a precursor semiconductor fin 14 (formed from patterning the top semiconductor layer 30), one of the patterned hard masks 41 and one of the plurality of triple SIT spacer composite structures 60.

Figure 5:
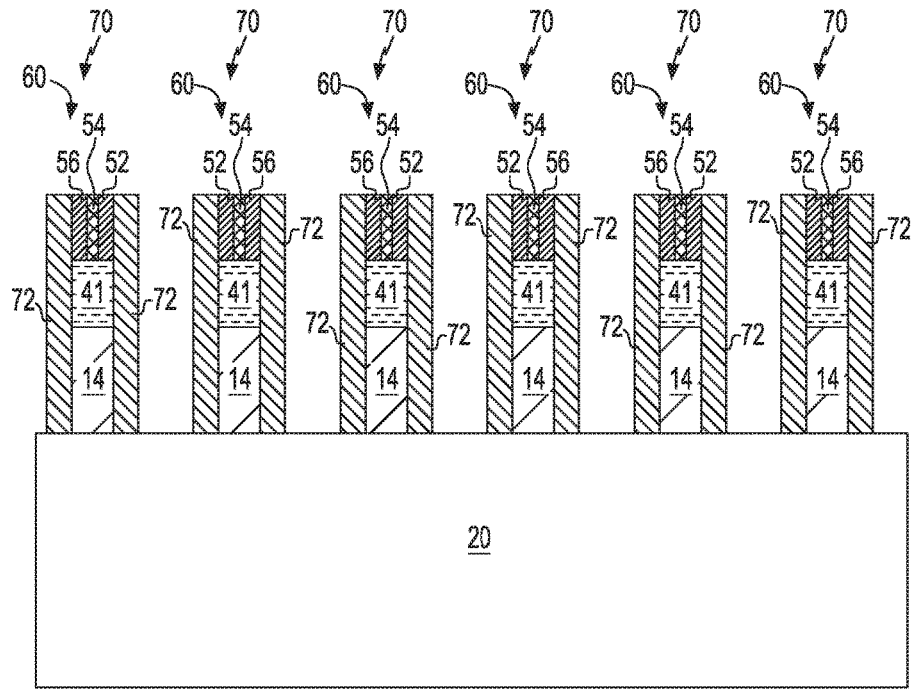
FIG. 5 is a vertical cross-sectional view of the exemplary semiconductor structure of FIG. 4 after a protective oxide layer has been formed on sidewalls of each of the precursor semiconductor fin structures.

Referring to FIG. 5, an oxide layer (not shown) is deposited over the top and side surfaces of each of the precursor semiconductor fin structures 70, and on exposed surfaces of the top surface of the insulator layer 20 in between the precursor semiconductor fin structures 70 using a conformal deposition process such as, for example, ALD or PCVD. An etch process such as, for example, RIE is performed to remove the oxide layer from the top surface of each of the precursor semiconductor fin structures 70, and from portions of the top surface of the insulator layer 20 in between the precursor semiconductor fin structures 70 such that the oxide layer remains on only the sidewalls of each the precursor semiconductor fin structures 70. This oxide on the sides of each of the precursor semiconductor fin structures 70 is referred to hereinafter as a protective oxide spacer 72.

The protective oxide spacer 72 laterally surrounds and contacts the triple SIT spacer composite structures 60, the patterned hard mask 41 and the precursor semiconductor fin 14 of each the precursor semiconductor fin structures 70. In addition, the protective oxide spacer 72 contacts exposed portions of the top surface of the insulator layer 20. Also, an upper surface of the protective oxide spacer 72 is coplanar with an upper surface (e.g., upper surface of triple spacer composite structure 60) of the precursor semiconductor fin structures 70, and a bottom surface of the protective oxide spacer 72 is co-planar with a bottom surface (e.g., bottom surface of the precursor semiconductor fin 14) of the precursor semiconductor fin structures 70. The protective oxide spacer 72 may be used to protect the outer surface of the precursor semiconductor fin 14 during an epitaxial growth process discussed hereinafter. In addition, the protective oxide spacer may be formed have a thickness of, for example, 10-20 nm.

Figure 6:
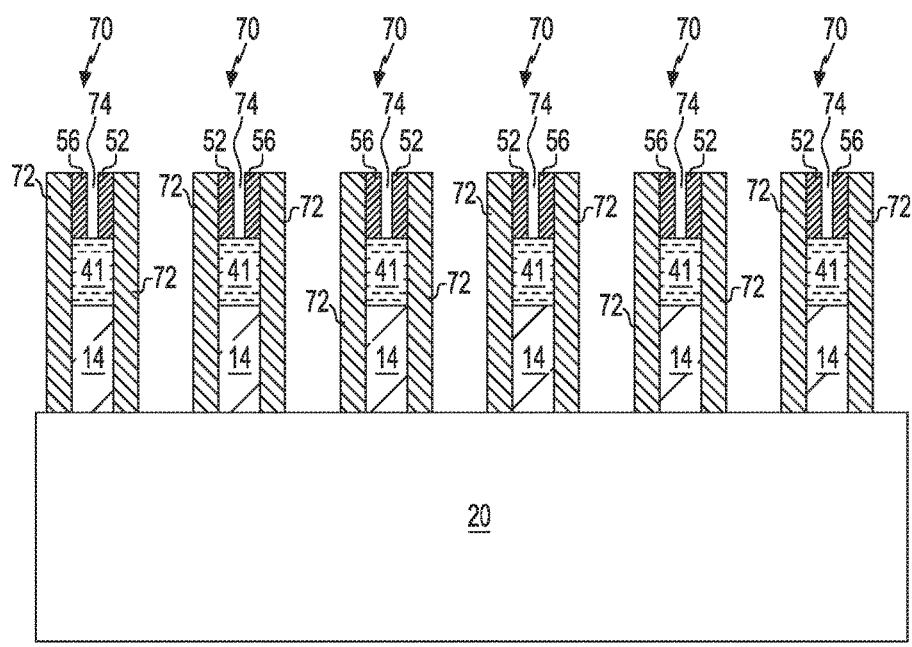
FIG. 6 is a vertical cross-sectional view of the exemplary semiconductor structure of FIG. 5 after removing the sacrificial SIT spacer from the triple SIT spacer composite structures of each of the precursor semiconductor fin structures.

Next, referring to FIG. 6, an etching process is performed to remove the sacrificial SIT spacer 54 (i.e., the middle spacer of the triple SIT spacer composite structure 60) from the triple SIT spacer composite structures 60, thereby leaving a first gap 74 between the first SIT spacer 52 and the second SIT spacer 56 in each of the precursor semiconductor fin structures 70, which exposes a top surface of the patterned hard masks 41. The etching process for removing the sacrificial SIT spacer 54 may be, for example, a wet etching process or a dry etching process. In the present embodiment, a wet etching process is performed using, for example, for ammonium peroxide chemistry or sulfuric peroxide.

Figure 7:
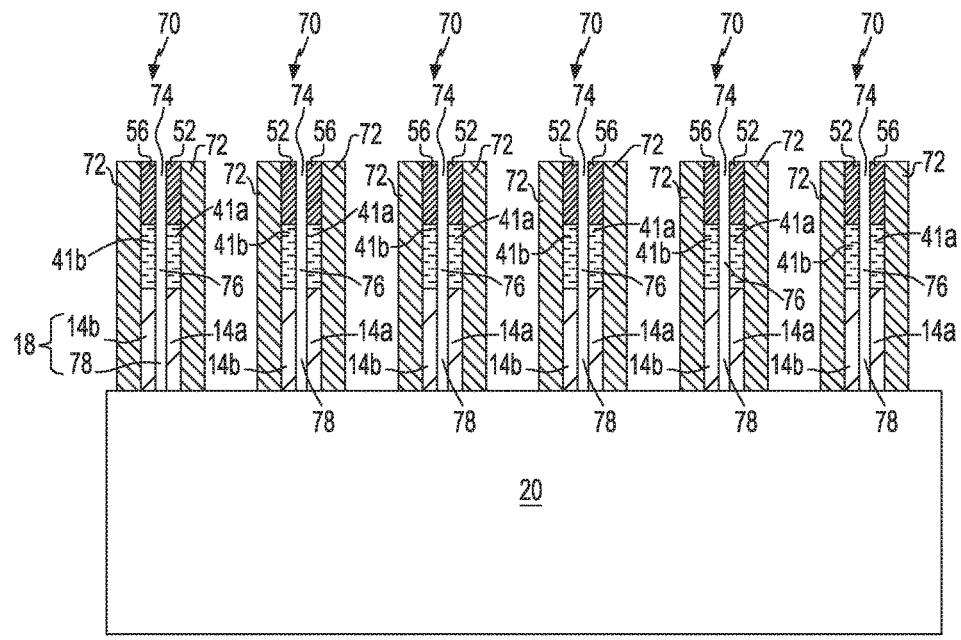
FIG. 7 is a vertical cross-sectional view of the exemplary semiconductor structure of FIG. 6 after the patterned hard mask and the precursor semiconductor fins have been patterned to form patterned hard mask portions and patterned precursor semiconductor fins in the precursor semiconductor fin structures.

Referring to FIG. 7, an RIE process using the first SIT spacer 52 and the second SIT spacer 56 of each of the precursor semiconductor fin structures 70 as an etch mask is performed to etch all the way through a corresponding of one of the patterned hard masks 41 and a corresponding one of the precursor semiconductor fins 14 of each of the precursor semiconductor fin structures 70, thereby forming a second gap 76 between patterned hard mask portions 41a, 41b (formed by etching the patterned hard mask 41) and a third gap 78 in the patterned precursor semiconductor fins 18 (formed by etching the precursor semiconductor fins 14) in each of the precursor semiconductor fin structures 70. The patterned precursor semiconductor fins 18 include a first vertical sidewall 14a and second vertical sidewall 14b with the third gap 78 located between the first vertical sidewall 14a and the second vertical sidewall 14b of the patterned precursor semiconductor fins 18. The third gap 78 of the patterned precursor semiconductor fins 18 exposes a top surface of the insulator layer 20.

Figure 8:
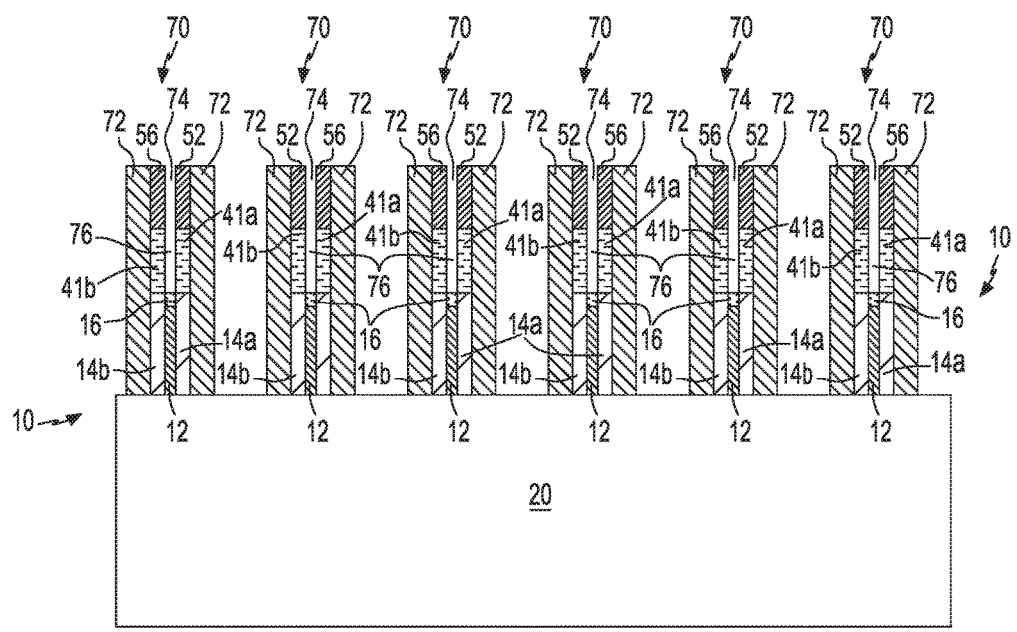
FIG. 8 is a vertical cross-sectional view of the exemplary semiconductor structure of FIG. 7 after epitaxially forming a semiconductor material and a cap in an inner core of the semiconductor fins.

Next, referring to FIG. 8, a semiconductor material may be formed in the third gap 78 of the precursor semiconductor fins 18 by, for example, a selective epitaxial growth (SEG) process using the first and second vertical sidewalls 14a, 14b of the patterned precursor semiconductor fins 18 of each of the precursor semiconductor fin structures 70 as a seed to grow a semiconductor material such as, for example, SiGe, Ge or III-V semiconductors, or a combination thereof in the third gap 78 of the patterned precursor semiconductor fins 18. In the present embodiment, an SiGe layer including germanium in an amount from 10 atomic % to 90 atomic % is epitaxially grown from the first and second vertical sidewalls 14a, 14b of the patterned precursor semiconductor fins 18 using an SEG process in the third gap 78 of the patterned precursor semiconductor fins 18 in each of the precursor semiconductor fin structures 70. In some embodiments, the semiconductor material epitaxially grown in third gap 78 is SiGe with a high percentage of germanium present (i.e., 50 atomic %-90 atomic % of germanium).

Next, a cap 16 including, for example, silicon or silicon germanium with a low germanium content (e.g. 10 atomic % or less of germanium) is epitaxially formed on the semiconductor material (e.g., SiGe with 10 atomic % to 90 atomic % of germanium) in the third gap 78 of the patterned precursor semiconductor fins 18 to thereby transform the patterned precursor semiconductor fins 18 in each of the precursor semiconductor fins structures 70 into a plurality of semiconductor fins 10. Alternatively, and in other embodiments, the cap 16 is formed on the semiconductor material using other methods known in the art besides SEG. In the present embodiment, the cap 16 includes silicon. In other embodiments, the cap 16 is omitted.

After formation of the semiconductor material in the third gap 78 of the patterned precursor semiconductor fin 18, the patterned precursor semiconductor fin 18 having the semiconductor material formed therein may then hereinafter be referred to as a fin 10, if no cap 16 is being formed. Otherwise, in embodiments in which the cap 16 is being formed, the patterned precursor semiconductor fin 18 can then be referred to as a fin 10, once the cap 16 is formed on the semiconductor material in the third gap 78 of the patterned precursor semiconductor fin 18.

The semiconductor material (e.g., SiGe with 10 atomic % to 90 atomic % of germanium) inside the third gap 78 of the patterned precursor semiconductor fins 18 is hereinafter referred to as the inner core 12 of the semiconductor fins 10, and the first and second vertical sidewalls 14a, 14b of the patterned precursor semiconductor fins 18 is now hereinafter referred to as the outer shell of the semiconductor fins 10. Thus, the semiconductor fins 10 formed in the present embodiment include an inner core 12 including a semiconductor material (e.g., SiGe with 10 atomic % to 90 atomic % of germanium) therein, an outer shell 14a, 14b that laterally contacts and surrounds the inner core 12 of the semiconductor fins 10, and a cap (e.g. Si) that is located on an upper surface of the semiconductor material that provides the inner core 12. In some embodiment, the cap 16 is present on the inner core 12 and a top surface of the cap 16 is coplanar with a top surface of the first and second vertical sidewalls of the outer shell 14a, 14b of the semiconductor fins 10 in each of the precursor semiconductor fin structures 70. In other embodiments as mentioned above, the cap 16 may be omitted.

Figure 9:
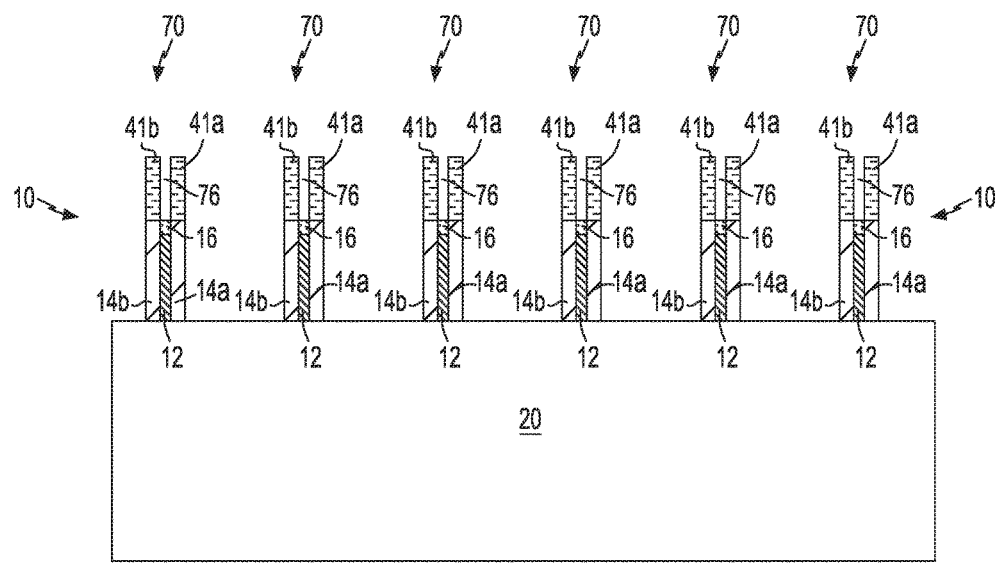
FIG. 9 is a vertical cross-sectional view of the exemplary semiconductor structure of FIG. 8 after the protective oxide layers, and the first SIT spacers and the second SIT spacers have been removed such that only the hard mask portions remain on the semiconductor fins.

Next, referring to FIG. 9, the protective oxide spacers 72, and the first SIT spacers 52, and the second SIT spacers 56 of each of the precursor semiconductor fin structures 70 are all removed, thereby leaving the hard mask portions 41a, 41b on the semiconductor fins 10. The protective oxide spacers 72, and the first SIT spacer 52, and the second SIT spacer 56 may be removed by, for example, a wet etching process using for example, hydrofluoric acid (HF) or by a dry etch process such as, for example, RIE.

Further, the patterned hard mask portions 41a, 41b are all removed from the precursor semiconductor fin structures 70 using for example, a wet etch (e.g., hot phosphoric acid) or a dry etch (e.g., RIE) to thereby leave the plurality of semiconductor fins 10 on the insulator layer 20 of the SOI substrate 1 and form the semiconductor structure 100 as shown in FIG. 1.

Moreover, a gate structure (not shown) may be formed over the semiconductor fins 10, and then a source region (not shown) and a drain region (not shown) may be, for example, epitaxially grown on exposed portions of the semiconductor fins 10. Further, the source region and drain region may be provided with a desired dopant to define a plurality of FinFETs by any suitable method known in the art (e.g., ion implantation).

Figure 10:
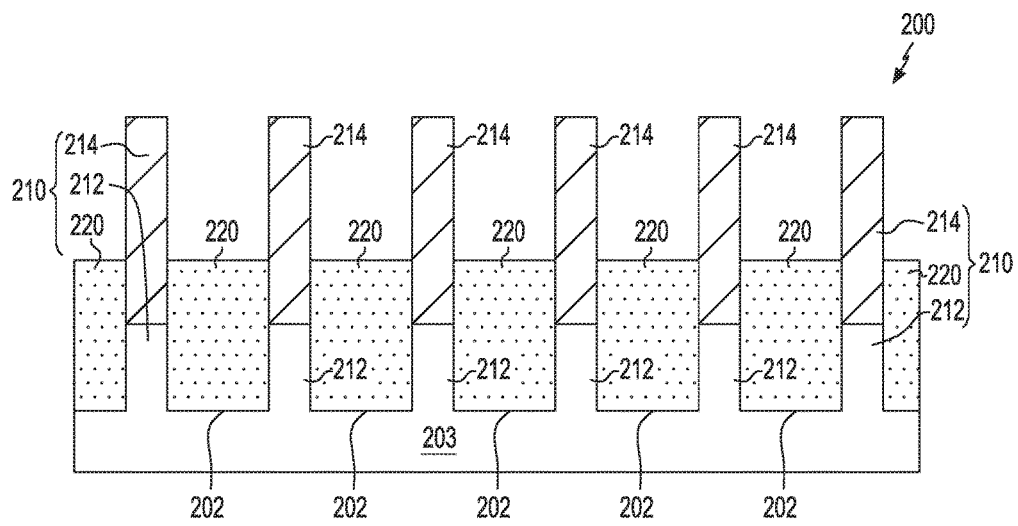
FIG. 10 is a vertical cross-sectional view of a plurality of semiconductor fins defined by a plurality of trenches formed in a bulk semiconductor substrate, and wherein the semiconductor fins are form integrally with the bulk semiconductor substrate according to a second embodiment of the application.
Figure 11:
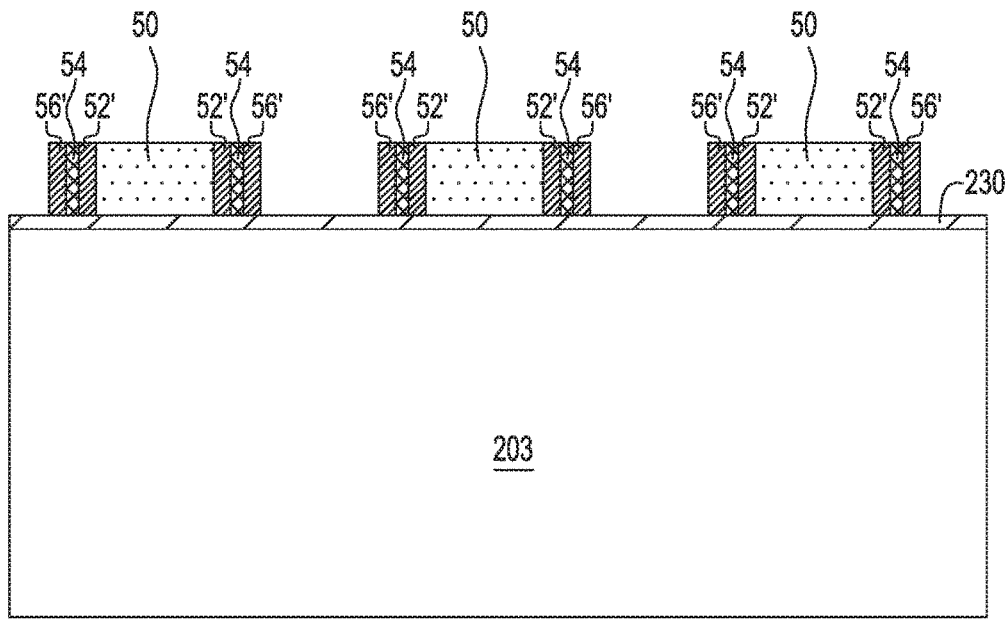
FIG. 11 is a vertical cross-sectional view of an exemplary semiconductor structure including a bulk semiconductor substrate, a dielectric layer disposed on the bulk semiconductor substrate, a plurality of mandrels disposed on the dielectric layer, and a first sidewall image transfer (SIT) spacer, a sacrificial SIT spacer and a second SIT spacer sequentially formed on sidewalls of the mandrels according to the second embodiment.

FIG. 10 illustrates a semiconductor structure 200 according to a second embodiment of the present application. Elements in the present embodiment that are the same as an element of the first embodiment with be labeled in the specification and the drawings with the same reference numeral as that element of the first embodiment.

The semiconductor structure 200 is an intermediate structure in the manufacture of a FinFET device and includes a plurality of trenches 202 formed in a bulk semiconductor substrate 203 that define a plurality of semiconductor fins 210 that are integral with the bulk semiconductor substrate 203. The bulk semiconductor substrate 203 may be formed from a semiconductor material such as, for example, silicon (Si), germanium (Ge), silicon germanium (SiGe), silicon germanium carbide (SiGeC), silicon carbide (SiC), an III-V compound semiconductor, an II-VI compound semiconductor or any combinations thereof. In the present embodiment, the bulk semiconductor substrate 203 is formed of, for example, silicon. Alternatively, and in some embodiments, the bulk semiconductor substrate 203 is formed of, for example, SiGe with germanium present in a low amount (e.g., 10 atomic % or less of germanium). It is noted that exemplary embodiments of the present invention are not limited to using a bulk semiconductor substrate 203 but rather in other embodiments an SOI substrate may instead also be used to form the semiconductor fins 210.

Referring back to the present embodiment illustrated in FIG. 10, the semiconductor fins 210 each include a lower portion 212, and an upper portion 214 located on an upper surface of the lower portion 212. For example, in the present embodiment, the lower portion 212 is formed from part of the bulk semiconductor substrate 203 and includes essentially the same material as the bulk semiconductor substrate. In some embodiments, the lower portion 212 of the semiconductor fins 210 includes, for example, silicon, or SiGe with germanium present in a low amount (e.g., 10 atomic % or less of germanium). Moreover, in the present embodiment, the upper portion 214 of the semiconductor fins 210 includes a semiconductor material such as, for example, SiGe, Ge, a III-V semiconductor, or a combination thereof formed by, for example, an epitaxial growth process within a patterned precursor semiconductor fin 203a' as described in further detail in connection with FIGS. 11-19. In some embodiments, the upper portion 214 of the semiconductor fins 210 includes, for example, SiGe with 10 atomic % to 90 atomic % of Ge. In other embodiments, the upper portion 214 of the semiconductor fins 210 includes, for example, SiGe with 20 atomic % to 90 atomic % of Ge. Each of the semiconductor fins 210 may have a width of, for example, 4 nm-16 nm.

In addition, the semiconductor structure 200 further includes an isolation material 220 located in the trenches 202 formed in the bulk semiconductor substrate 203 and between each of the semiconductor fins 210 among the plurality of semiconductor fins 210. For example, in an embodiment, the isolation material 220 includes, for example, an oxide such as silicon dioxide. The isolation material 220 partially fills the trenches 202. In other words, in the present embodiment, an upper surface of the isolation material 220 in the trenches 202 is lower than an upper surface of the trenches 202. In addition, in the present embodiment, an upper surface of the isolation material 220 is higher than an upper surface of the lower portion 212 of the semiconductor fins 210, and the upper surface of the isolation material 220 is lower than an upper surface of the upper portion 214 of the semiconductor fins 210.

Reference is now made to FIGS. 11-19, which illustrate a method for fabricating the semiconductor structure 200 shown in FIG. 10 according to the second embodiment of the present application. Specifically, and referring to FIG. 11, a bulk semiconductor substrate 203 is provided. In the present embodiment, the bulk semiconductor substrate 203 includes, for example, silicon or silicon germanium with germanium in an amount of 10 atomic % or less, but as noted above exemplary embodiments are not limited thereto. Alternatively, and in other embodiments, an SOI substrate may be provided instead in the bulk semiconductor substrate 203.

Next, a dielectric layer 230 is deposited onto the top surface of the bulk semiconductor substrate 203 using a deposition process such as, for example, chemical vapor deposition (CVD), atomic layer deposition (ALD), physical vapor deposition (PVD), evaporation, or spin-coating. The dielectric layer 230 may include, for example, a dielectric material such as, for example, an oxide or a nitride. In the present embodiment, the dielectric layer 230 includes an oxide (e.g., silicon dioxide). Alternatively, and in other embodiments, the dielectric layer 230 includes silicon nitride. Moreover, in some embodiments, the formation of the dielectric layer 230 may be omitted.

Next, a plurality of mandrels 50 may be formed on the dielectric layer 230, and then a first SIT spacer 52', a sacrificial SIT spacer 54 and a second SIT spacer 56' may be sequentially formed on the sidewalls of the mandrels 50 in essentially the same manner as described above with regard to the first embodiment illustrated in FIG. 2, except that in the present embodiment, the first and second SIT spacers 52', 56' are formed of a nitride instead of an oxide. Otherwise all of the materials, sizes and processes for forming the mandrels 50, the first SIT spacer 52', the sacrificial SIT spacer 54, and the second SIT spacer 56' in the present embodiment may be the same as set forth above in connection with the mandrels 50, the first SIT spacer 52, the sacrificial SIT spacer 54, and the second SIT spacer 56 in the first embodiment. However, in accordance with the present embodiment, the dielectric layer 230 may include a nitride and the first SIT spacer 52' and the second SIT spacer 56' may instead each include an oxide.

Figure 12:
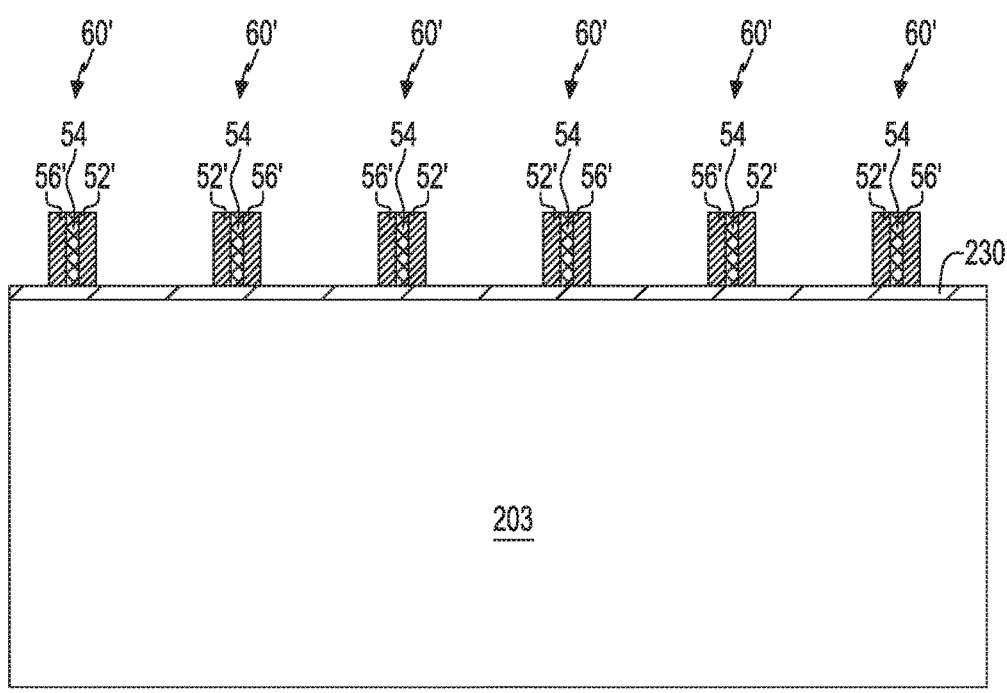
FIG. 12 is a vertical cross-sectional view of the exemplary semiconductor structure of FIG. 11 after removing the mandrels to form triple SIT spacer composite structures on the dielectric layer.

Next, referring to FIG. 12, the mandrels 50 may then be removed selective to the first SIT spacer 52', the second SIT spacer 56' and the sacrificial SIT spacer 54 using an anisotrophic dry etch and/or wet etching process in essentially the same manner as discussed above in FIG. 3 of the first embodiment, thereby leaving a plurality of triple SIT spacer composite structures 60' located on the top surface of the dielectric layer 230. The triple SIT spacer composite structures 60' each include the first SIT spacer 52', the second SIT spacer 56' and the sacrificial SIT spacer 54 in between the first SIT spacer 52' and the second SIT spacer 56'. Further, as shown in FIG. 12, a pattern of the plurality of triple spacer composite structures 60' is revealed as a result of the removal of the mandrels 50.

Figure 13:
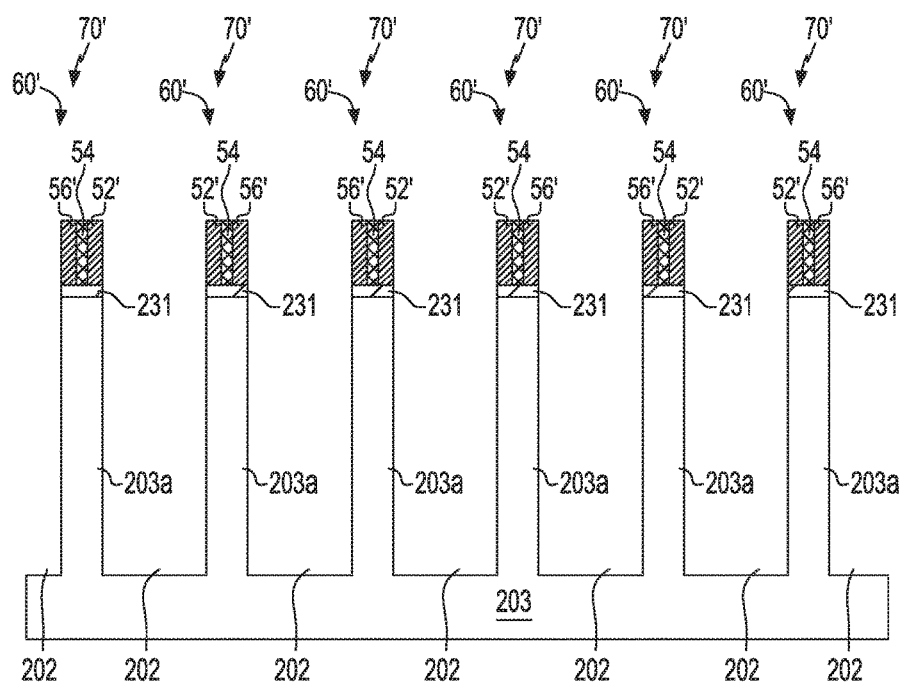
FIG. 13 is a vertical cross-sectional view of the exemplary structure of FIG. 12 after etching the dielectric layer and the bulk semiconductor substrate to form precursor semiconductor fin structures each including a sequential stack of one of the precursor semiconductor fins formed integrally with the bulk substrate and defined by a plurality trenches formed in the bulk semiconductor substrate, one of the dielectric layer patterns and one of the triple SIT spacer composite structures.

Following removal of the mandrels 50, the triple SIT spacer composite structures 60' are then used to transfer the pattern to the dielectric layer 230 and the bulk semiconductor substrate 203, as shown in FIG. 13. In the present exemplary embodiment, the pattern of the triple SIT spacer composite structures 60' is first transferred to the dielectric layer 230, forming the patterned dielectric layers 231. This step may be carried out using, for example, a RIE process.

The patterned dielectric layer 231 can then be used to pattern the bulk semiconductor substrate 203. Again, for example, a RIE process may be used to etch trenches 202 into the bulk semiconductor substrate 203, thereby defining a plurality of precursor semiconductor fin structures 70'. The precursor semiconductor fin structures 70' each include a sequential stack of a precursor semiconductor fin 203a (formed from patterning the bulk semiconductor substrate 203) that is integral with the bulk semiconductor substrate 203, one of the patterned dielectric layers 231 and one of the plurality of triple SIT spacer composite structures 60'. The particular etch chemistry used can be varied for etching selectivity between the dielectric layer 230 and the bulk semiconductor substrate 203. Alternatively, as provided above, the use of a dielectric layer 230 in this process flow is optional. Thus, in the instance where a dielectric layer 230 is not employed, the pattern of the triple spacer composite structures 60' is at this step transferred directly into the bulk semiconductor substrate 203 (e.g., using RIE).

Figure 14:
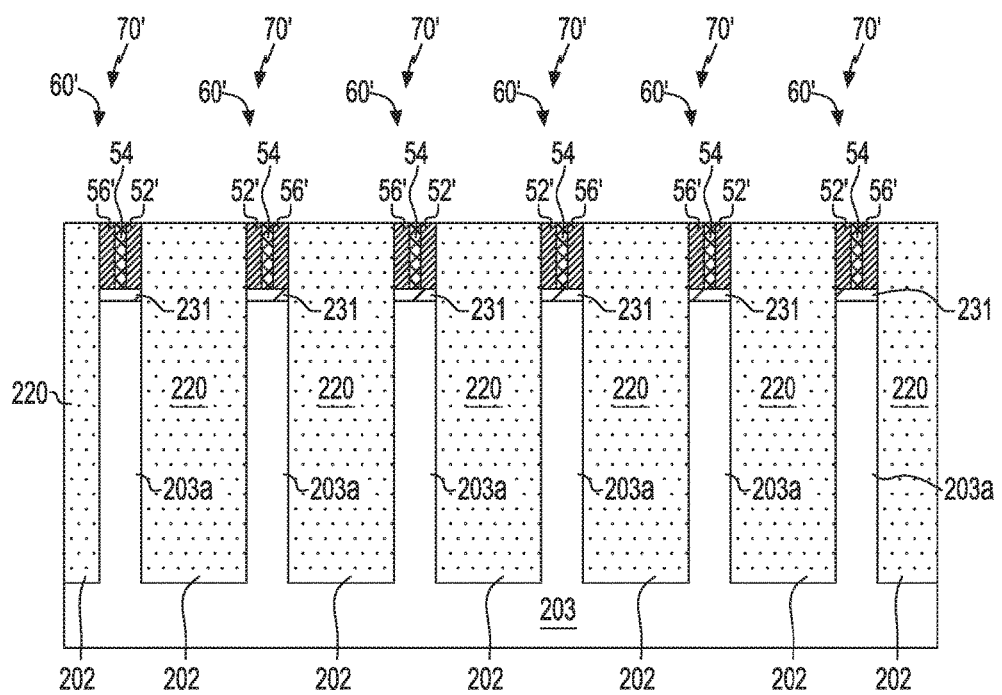
FIG. 14 is a vertical cross-sectional view of the exemplary structure of FIG. 13 after filling the trenches with an isolation material.

Now referring to FIG. 14, the trenches 202 between the precursor semiconductor fin structures 60' may then be filled with an isolation material 220 such as, for example, an oxide including silicon dioxide. A planarization process can follow the trench fill, thereby providing, for example, a shallow trench isolation (STI). In the present embodiment, the top surface of the isolation material 220 in each of the trenches 202 is coplanar with the top surface of each of the trenches 220. An STI liner may also be provided as needed in the trenches prior to depositing the trench dielectric material therein. Alternatively, and in other embodiments, a protective oxide spacer such as the protective oxide layer 72 set forth in the FIG. 5 of the first embodiment may instead be formed on the sidewalls of the precursor semiconductor fins structures 70' in similar fashion as set forth in the FIG. 5 of the first embodiment rather than filling the trenches 202 with isolation material 220.

Figure 15:
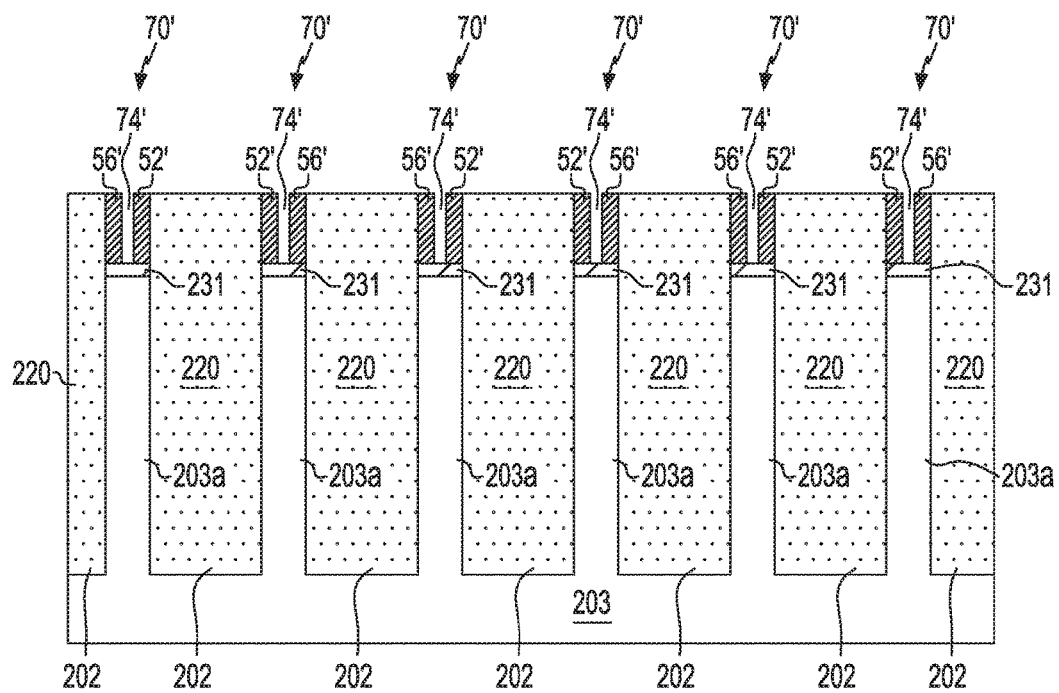
FIG. 15 is a vertical cross-sectional view of the exemplary semiconductor structure of FIG. 14 after removing the sacrificial SIT spacer from the triple SIT spacer composite structures of each of the precursor semiconductor fin structures.

Next, referring to FIG. 15, an etching process is performed to remove the sacrificial SIT spacer 54 (i.e., the middle spacer of the triple SIT spacer composite structure 60') from each of the precursor semiconductor fin structures 70', thereby leaving a first gap 74' between the first SIT spacer 52' and the second SIT spacer 56' in each of the precursor semiconductor fin structures 70', which thereby exposes a top surface of the patterned dielectric layers 231 in each of the precursor semiconductor fin structures 70'. The same process for removing the sacrificial SIT spacer 54 as set forth in FIG. 6 of the first embodiment may also be used in the present embodiment to remove the sacrificial SIT spacer 54.

Figure 16:
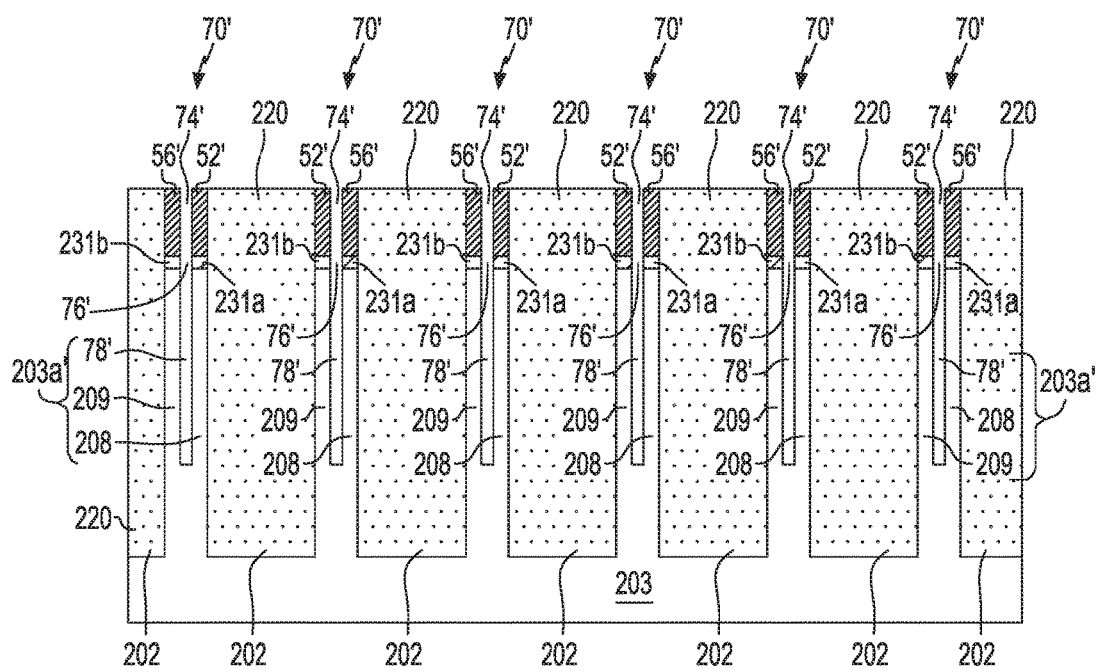
FIG. 16 is vertical cross-sectional view of the exemplary structure of FIG. 15 after the patterned dielectric layer and the precursor semiconductor fins have been patterned to form patterned dielectric layer portions and patterned precursor semiconductor fins in the precursor semiconductor fin structures.

Referring to FIG. 16, an RIE process using the first SIT spacer 52' and the second SIT spacer 56' of each of the precursor semiconductor fin structures 70' as an etch mask is performed to etch all the way through a corresponding of one of the patterned dielectric layers 231 and a corresponding one of the precursor semiconductor fins 203a of each of the precursor semiconductor fin structures 70', thereby forming a second gap 76' between patterned dielectric layer portions 231a, 231b (formed by etching the patterned dielectric layer 231) and a third gap 78' in the patterned precursor semiconductor fins 203a' (formed by etching the precursor semiconductor fins 203a) in each of the precursor semiconductor fin structures 70'. The patterned precursor semiconductor fins 203a' each include a base portion 206, a first vertical sidewall 208 and second vertical sidewall 209 extending upward from the base portion 206 in a direction away from the bulk semiconductor substrate 203 with the third gap 78' located between the first vertical sidewall 208 and the second vertical sidewall 209. The third gap 78' of the patterned precursor semiconductor fins 203a' exposes a top surface of the base portion 206 of the patterned precursor semiconductor fins 203a'.

Figure 17:
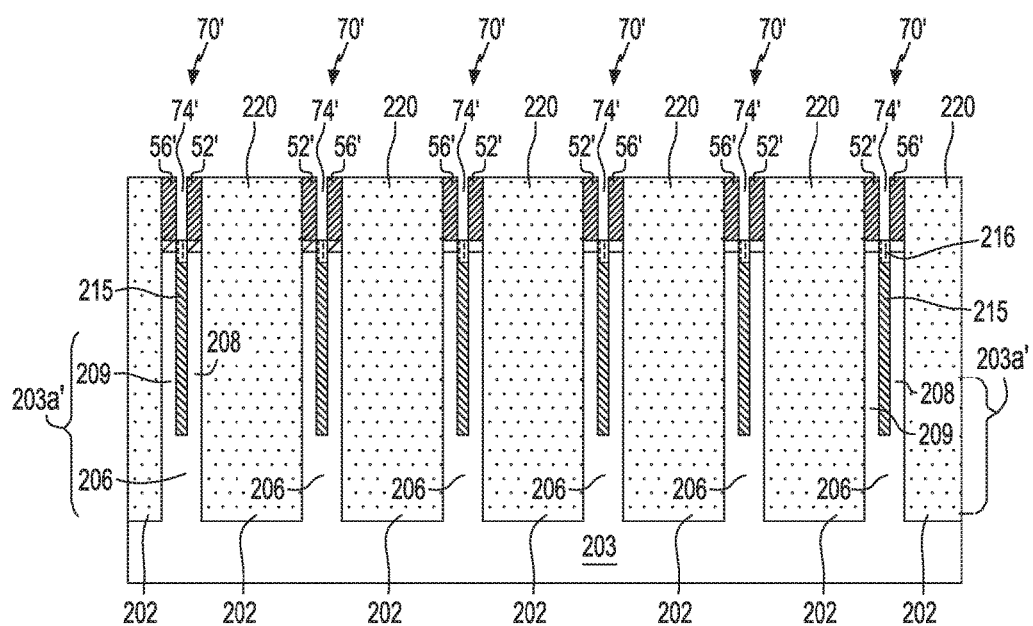
FIG. 17 is a vertical cross-sectional view of the exemplary semiconductor structure of FIG. 16 after epitaxially forming a semiconductor material and a cap inside the semiconductor fins.
Figure 18:
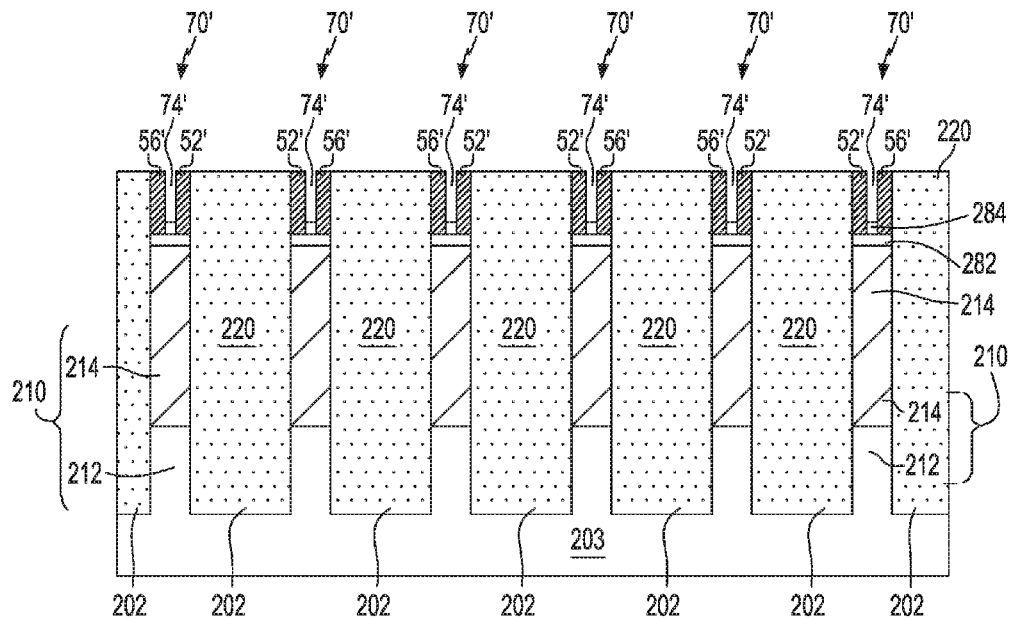
FIG. 18 is a vertical cross-sectional view of the exemplary semiconductor structure of FIG. 17 after performing a condensation and anneal process on the fin.

Next, referring to FIG. 17, a semiconductor material 215 is formed in the third gap 78' of the patterned precursor semiconductor fins 203a' by, for example, a selective epitaxial growth (SEG) process using the first vertical sidewall 208, the second vertical sidewalls 209 and the upper surface of the base portion 206 of the patterned precursor semiconductor fins 203' of each of the precursor semiconductor fin structures 70' as a seed to grow the semiconductor material 215 (e.g., SiGe, Ge or III-V semiconductors, or a combination thereof) in the third gap 78' of the patterned precursor semiconductor fins 203a'. In the present embodiment, an SiGe layer including germanium in an amount from 10 atomic % to 90 atomic % is deposited and epitaxially grown in the third gap 78' of the patterned precursor semiconductor fins 203a' in each of the precursor semiconductor fin structures 70' from the first and second vertical sidewalls 208, 209 and the upper surface of the base portion 206 of the patterned precursor semiconductor fins 203a'. In some embodiments, the layer of semiconductor material 215 deposited and epitaxially grown in third gap 78' is SiGe with a high percentage of germanium present (i.e., 50 atomic %-90 atomic % of germanium).

Next, a cap 216 including, for example, silicon or silicon germanium with a low germanium content (e.g. 10 atomic % or less of germanium) is epitaxially formed on the semiconductor material 215 (e.g., SiGe layer with 10 atomic %-90 atomic % of germanium) in the third gap 78' of the patterned precursor semiconductor fins 203a'. Alternatively, and in other embodiments, the cap 216 is formed on the SiGe layer 215 using other methods known in the art besides SEG. In the present embodiment, the cap 216 includes, for example, silicon. Also, in some embodiment, the cap 216 located on the semiconductor material layer 215 fills the second gap 76' and an upper surface of the cap 216 is higher than upper surfaces of the patterned dielectric layer portions 231a, 231b.

After the growth of semiconductor material 215 (e.g., SiGe with 10 atomic %-90 atomic % of germanium) inside the third gap 78' and the optional deposition of the cap 216, a condensation/annealing process may then be carried out. For example, in the present embodiment, condensation may be achieved by thermal oxidation of the semiconductor material 215 (e.g., SiGe with 10 atomic %-90 atomic % of germanium) in the third gap 78' of the patterned precursor semiconductor fins 203a' and the cap 216.

As a result of the condensation and annealing process, the patterned precursor semiconductor fins 203a' are now transformed into a plurality of semiconductor fins 210 which each include a lower portion 212 and an upper portion 214 located on the lower portion 212. In particular, the first and second vertical sidewalls 208, 209 of the patterned precursor semiconductor fins 203a' and the cap 216 are all transformed into the semiconductor material 215 (e.g., SiGe with 10 atomic %-90 atomic % germanium) inside the third gap 78 of the patterned precursor semiconductor fins 203a' by the above condensation and anneal process to define an upper portion 214 of the semiconductor fins 210. Alternatively, and in other embodiment, the cap 216 may not be transformed into the semiconductor material 215 but rather the cap 216 remains essentially unchanged.

On the other hand, the lower portion 212 of the semiconductor fins 210, which is formed from the base portion 206 of the patterned precursor semiconductor fins 203a', remains largely unchanged (e.g., only a minimal amount of the semiconductor material 215 diffuses into the lower portion 212 of the semiconductor fin 210) by the condensation/anneal process. Thus, the lower portion 212 of the semiconductor fin 210 still includes essentially the same material (e.g., Si) as the base portion 206 of the patterned precursor semiconductor fins 203a' that was present prior to the condensation and anneal process. The lower portion 212 of the semiconductor fin 210 can be regarded as the inactive region of the semiconductor fin 210 for a FinFET device, and the upper portion 214 can be regarded as an active region of the semiconductor fin 210 for a FinFET device.

The condensation/anneal process causes the germanium to be uniformly distributed across the upper portion 214 of the semiconductor fin 210. In addition, the condensation and annealing process causes the oxidation of the patterned dielectric layer portions 231a, 231b to thereby transform the patterned dielectric layer portions 231a, 231b into an oxidized dielectric layer 282 and also causes the formation of an additional oxide layer 284 on an upper surface of the oxidized dielectric layer 282 in the first gap 74' of the precursor semiconductor fin structure 70'.

The condensation/annealing process may be performed at a temperature in a range of, for example, 500-950° C. in an oxidizing atmosphere (e.g., nitrogen ($N_2$)/oxygen ($O_2$)) for a time period in a range of, for example, 5 minutes to 2 hours. It is noted that the lower the temperature used for the condensation/anneal process, the longer the process time for the condensation/anneal can be. Moreover, it is also noted that the higher the temperature used for the condensation/anneal process, the shorter the process time for the condensation/anneal can be. For example, in some embodiments, a temperature of 500° C. is used for the condensation/anneal process with a process time of 2 hours. In other embodiments, a temperature of 950° C. is used for the condensation/anneal process with a process time of five minutes.

Lastly, the oxidized dielectric layer 282, the additional oxide layer 284 are removed from the precursor semiconductor fin structures 70' using for example, a wet etch (e.g., hot phosphoric acid) or a dry etch (e.g., RIE), and the isolation material 220 in the trenches 202 between the precursor semiconductor fin structures 70' is partially recessed by, for example, a suitable dry etching or wet etching process known in the art to thereby form the semiconductor structure 200 of FIG. 10 including the plurality of trenches 220 formed in the bulk semiconductor substrate 203 and which defines the plurality of semiconductor fins 210 that are integral with the bulk semiconductor substrate 203.

Moreover, a gate structure (not shown) may be formed over the semiconductor fins 210, and then a source region (not shown) and a drain region (not shown) may be, for example, epitaxially grown on exposed portions of the semiconductor fins 210. Further, the source region and drain region may be provided with a desired dopant to define a plurality of FinFETs by any suitable method known in the art (e.g. ion implantation).

With the above-mentioned methods of exemplary embodiments of the present application, channels formed of, for example, SiGe having a high atomic percentage of germanium (i.e., 50 atomic %-90 atomic % of germanium) may be formed without the above-mentioned difficulties encountered in the conventional art in connection with forming high atomic % Ge channels for nodes. As discussed above, with conventional methods, it may be extremely difficult to form stable high atomic % germanium films without these germanium films incurring significant physical/damage caused by wet etching processes and/or dry etching processes (e.g., RIE) when taking these high atomic % germanium films downstream.

In contrast, in exemplary embodiments of the present application, a precursor semiconductor fin (used to form the final semiconductor fins) and having an inner core filled with semiconductor material (e.g., SiGe with a high atomic % of Ge) and an outer shell (e.g., Si) surrounding the inner core may prevent due to its outer shell (e.g. Si) an attack on the semiconductor material (e.g., SiGe) that will ultimately be part of a channel region of a node. Also, since only a thin semiconductor layer (e.g. SiGe layer) is formed inside the precursor semiconductor fin inner core, the thin semiconductor layer will have a low probability of defect formation.

Figure 19:
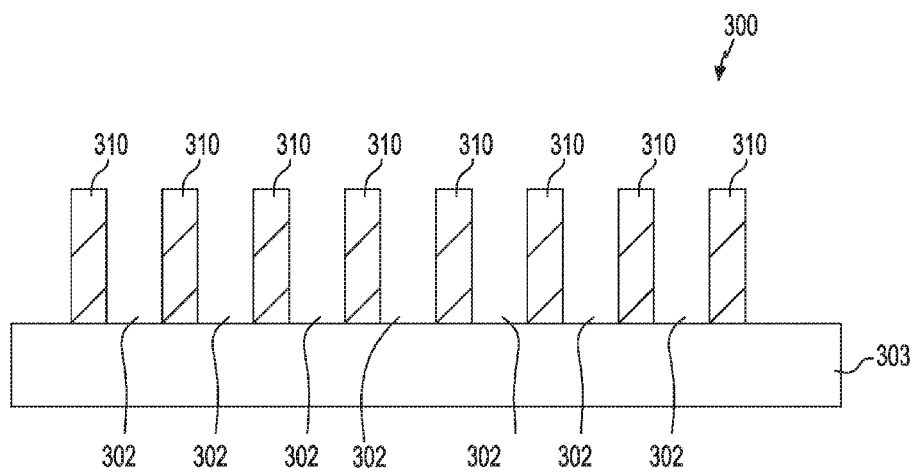
FIG. 19 is a vertical cross-sectional view of a semiconductor structure including a plurality of semiconductor fins defined by a plurality of trenches in a bulk semiconductor substrate and formed integrally with the bulk semiconductor substrate according to a third embodiment of the present application.

Now referring to FIG. 19, a semiconductor structure 300 according to a third embodiment of the present application is shown. The semiconductor structure 300 may be an intermediate structure in the manufacture of a FinFET device and includes a plurality of trenches 302 formed in a bulk semiconductor substrate 303 that define a plurality of semiconductor fins 310 that are integral with the bulk semiconductor substrate 303. The bulk semiconductor substrate 303 may be formed from a semiconductor material such as, for example, silicon (Si), germanium (Ge), silicon germanium (SiGe), silicon germanium carbide (SiGeC), silicon carbide (SiC), an III-V compound semiconductor, an II-VI compound semiconductor or any combinations thereof. Alternatively, and in other exemplary embodiments, an SOI substrate may be used instead of the bulk semiconductor substrate 303.

Figure 22:
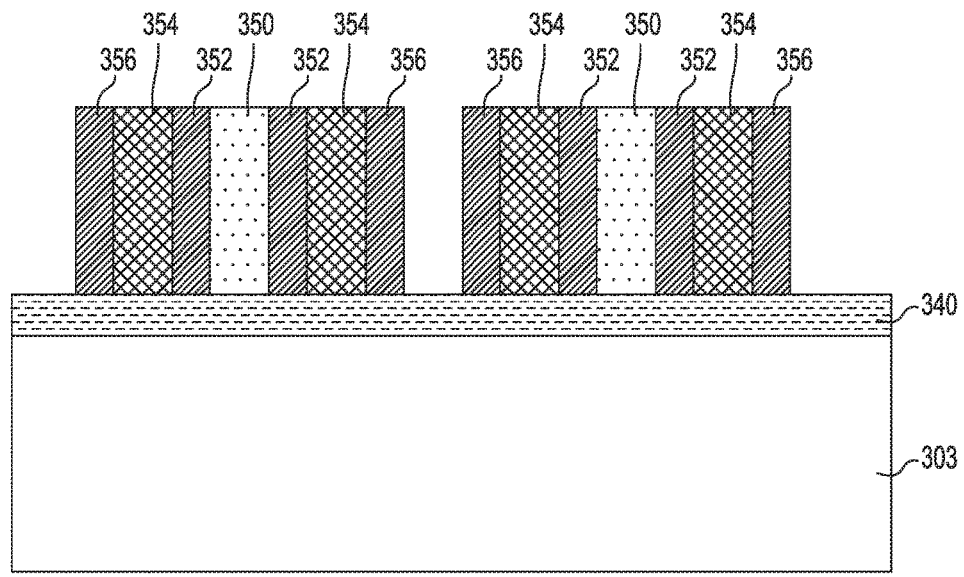
FIG. 22 is a vertical cross-sectional view of an exemplary semiconductor structure of FIG. 21 after forming a second SIT spacer on sidewalls of the first mandrel spacers.
Figure 23:
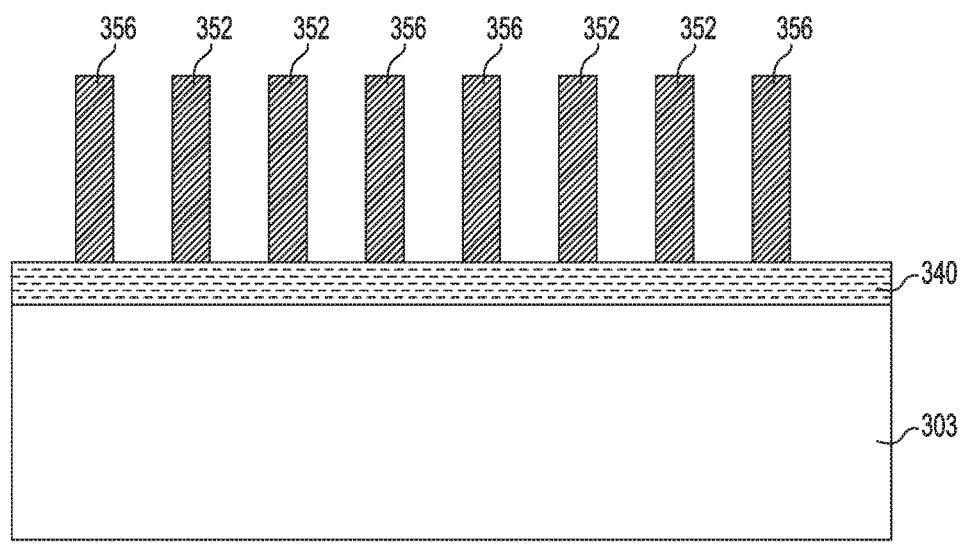
FIG. 23 is a vertical cross-sectional view of an exemplary semiconductor structure of FIG. 22 after removing the mandrels and the mandrel SIT spacers, thereby leaving a pattern of the first SIT spacers and the second SIT spacers on the pad layer.
Figure 24:
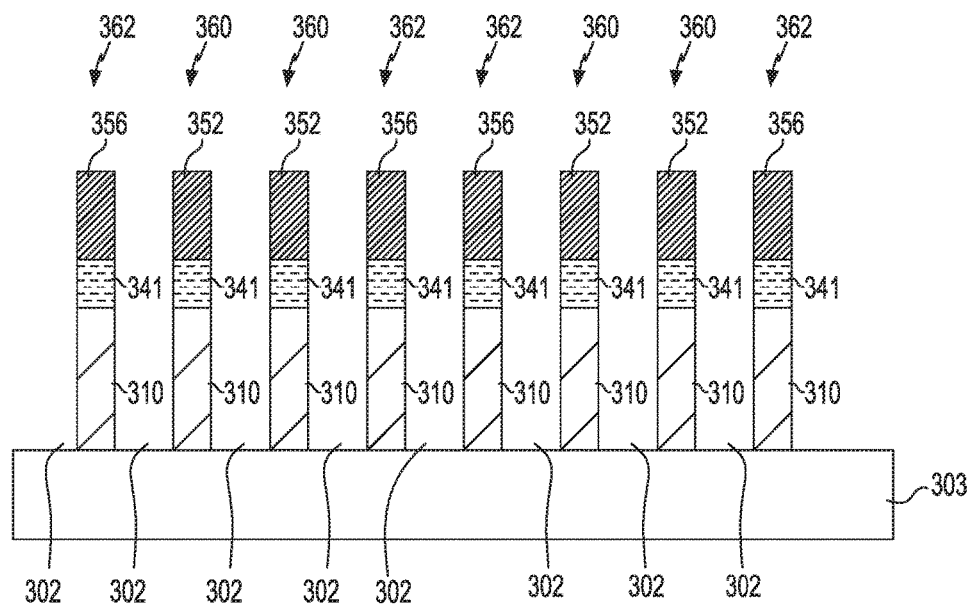
FIG. 24 is a vertical cross-sectional view of an exemplary semiconductor structure of FIG. 23 after etching the pad layer and the bulk semiconductor substrate to form a plurality of first precursor semiconductor fin structures that each include a sequential stack of one of the precursor semiconductor fins formed integrally with the bulk semiconductor substrate and defined by a plurality trenches formed in the bulk semiconductor substrate, one of the pad layer patterns and one of the first SIT spacers, and a plurality of second precursor semiconductor fin structures that each include a sequential stack of another one of the precursor semiconductor fins formed integrally with the bulk semiconductor substrate and defined by a plurality trenches formed in the bulk semiconductor substrate, another one of the pad layer patterns and one of the second SIT spacers.

Reference is now made to FIGS. 20-24, which illustrate a method for fabricating the semiconductor structure 300 shown in FIG. 24 according to the third embodiment of the present application. Specifically, and referring to FIG. 20, a bulk semiconductor substrate 303 is provided. The bulk semiconductor substrate 303 includes, for example, silicon (Si), germanium (Ge), silicon germanium (SiGe), silicon germanium carbide (SiGeC), silicon carbide (SiC), an III-V compound semiconductor, an II-VI compound semiconductor or any combinations thereof. Alternatively, and in exemplary embodiments, an SOI substrate may be used instead of the bulk semiconductor substrate 303.

Next, a pad layer 340 is deposited onto the top surface of the bulk semiconductor substrate 303 using a deposition process such as, for example, chemical vapor deposition (CVD), atomic layer deposition (ALD), physical vapor deposition (PVD), evaporation, or spin-coating. The pad layer 340 may include, for example, a dielectric material such as, for example, a nitride or an oxide. In the present embodiment, the pad layer 340 includes a nitride (e.g., silicon nitride). Alternatively, and in other embodiments, the pad layer 340 includes an oxide (e.g. silicon oxide). Moreover, in some embodiments, the formation of the pad layer 340 may be omitted.

Figure 20:
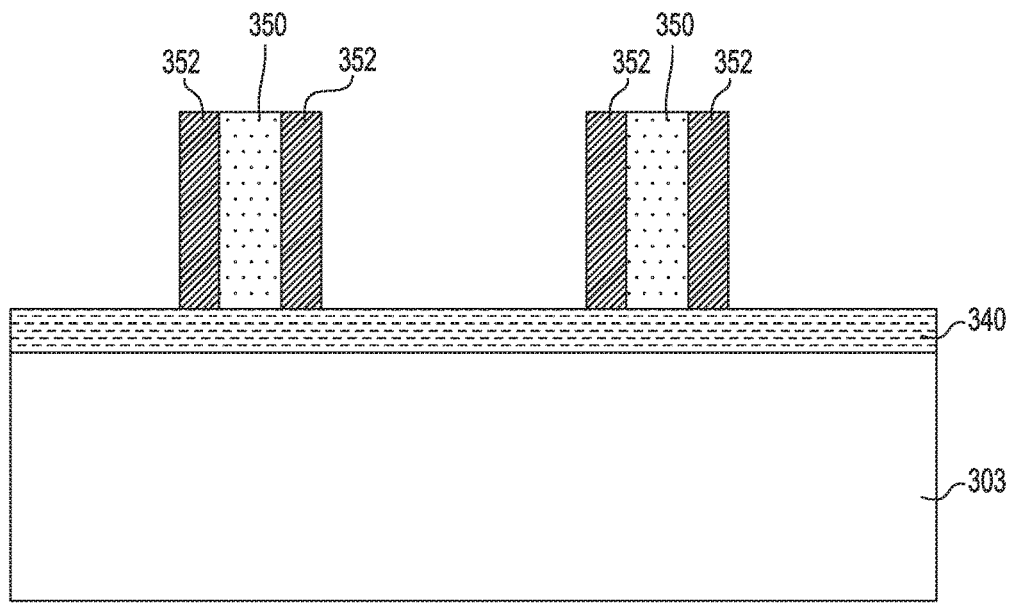
FIG. 20 is a vertical cross-sectional view of an exemplary semiconductor structure including a bulk semiconductor substrate, a pad layer disposed on the bulk semiconductor substrate, a plurality of mandrels disposed on the pad layer, and a first sidewall image transfer (SIT) spacer formed on sidewalls of the mandrels according to the second embodiment.

Next, a mandrel layer (not shown) is formed on the pad layer 340 using a deposition process such as, for example, atomic layer deposition (ALD) or chemical vapor deposition (CVD). The mandrel layer may include, for example, amorphous silicon, or amorphous carbon, or other suitable material. The mandrel layer is then subsequently patterned and etched using, for example, conventional lithography and etching processes to form a plurality of mandrels 350 on the pad layer 340, as shown in FIG. 20. The mandrels 350 can each have a width in the range of, for example, 15 nm-40 nm. In the present embodiment, there are two mandrels 350 formed but exemplary embodiments are not limited thereto but rather in other embodiments, less than two mandrels 350 or more than two mandrels 350 may be formed.

A conformal deposition process is then performed to form a first spacer material (not shown) on the top surface of the mandrels 350, the sides of the mandrels 350, and on exposed surfaces of the pad layer 340. In one embodiment, the first spacer material comprises an oxide, but other materials are applicable as well. For example, alternatively in another embodiment, the first spacer material may be, for example, a nitride. It is noted that in embodiments where the pad layer 340 includes a nitride that the first spacer material should be an oxide. Alternatively, in embodiments in which the pad layer 340 includes an oxide, then the first spacer material should include a nitride.

Further, the first spacer material is etched using a sidewall image transfer (SIT) spacer formation etch process. The SIT spacer etch process is, for example, an RIE process which removes the first spacer material from the top surfaces of the mandrels 350 and from the upper surfaces of the pad layer 340 in between the mandrels 350. As a result of the above RIE process, the first spacer material remains intact only on the sides of the mandrels 350. This first spacer material on the sides of the mandrels 350 is referred to hereinafter as first SIT spacer 352. The first SIT spacer 352 has a width of, for example, 6 nm-16 nm.

In addition, another conformal deposition process is then performed to form a mandrel spacer material (not shown) on the exposed top surfaces the mandrels 350 and on the first SIT spacers 352 located on the sides of the mandrels 350, and on exposed surfaces of the pad layer 350. In the present embodiment, the mandrel spacer material should comprise the same material as the mandrels 350 (e.g., polysilicon, amorphous silicon, or amorphous carbon).

Figure 21:
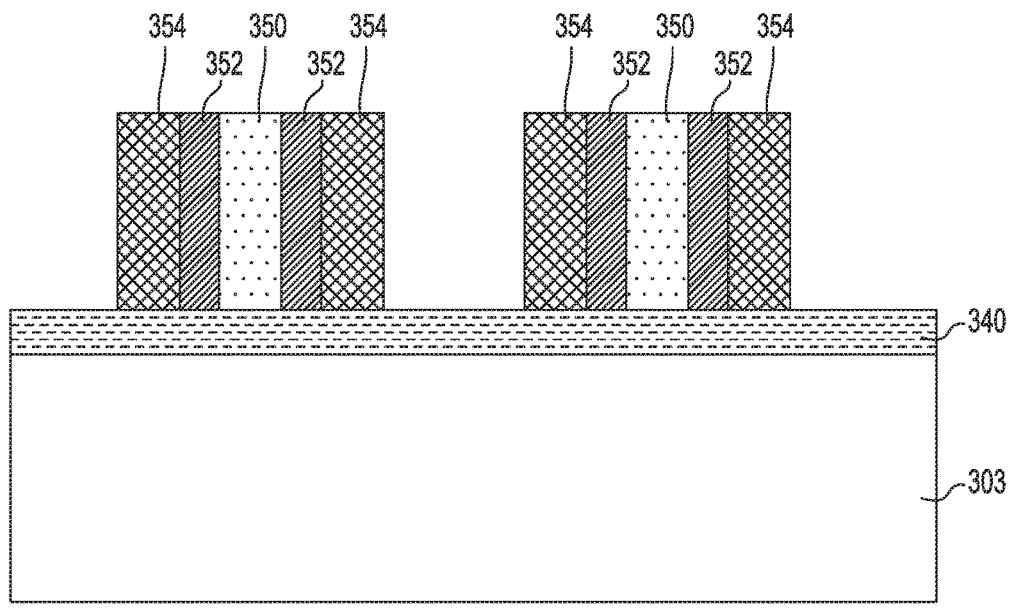
FIG. 21 is a vertical cross-sectional view of the exemplary semiconductor structure of FIG. 20 after forming a mandrel SIT spacer on sidewalls of the first SIT spacers.

Further, now referring to FIG. 21, the mandrel spacer material is etched using the SIT spacer formation etch process. The SIT spacer etch process removes the mandrel spacer material from the top surfaces of the mandrels 350 and from the upper surfaces of the pad layer 340. As a result of the RIE process, the mandrel spacer material remains intact only on the first SIT spacers 352 located on the sides of the mandrels 350. This mandrel spacer material on the first SIT spacer 352 is referred to hereinafter as the mandrel SIT spacer 354. The mandrel SIT spacer 354 has a width of, for example, from 15 nm-40 nm.

Moreover, as shown in FIG. 22, a second SIT spacer 356 is then formed on the sidewalls of the mandrel SIT spacer 354. The second SIT spacer 356 may be formed by the same processes and using the same materials as set forth above for forming the first SIT spacer 352. In some embodiments, the second SIT spacer 356 may be formed of, for example, an oxide. In other embodiments, the second SIT spacer 356 may be formed of, for example, a nitride. The second SIT spacer 356 may have a width of, for example, 6 nm-16 nm.

It is noted that in the present embodiment, the mandrels 350 and the mandrel SIT spacer 354 should be formed of the same materials as each other. In some embodiments, the mandrels 350 and the mandrel SIT spacer 354 are each formed of amorphous silicon. In other embodiments, the mandrels 350 and the mandrel SIT spacer 354 are each formed of amorphous carbon. In still other embodiments, the mandrels 350 and the mandrel SIT spacer 354 are each formed of polysilicon. In addition, in the present embodiment, the mandrels 350 and the mandrel SIT spacer 354 should be approximately the same size as each other. Moreover, in the present embodiment, the first SIT spacer 352 and the second SIT spacer 356 should be formed of the same material as each other.

Next, referring to FIG. 23, the mandrels 350 and the mandrel SIT spacers 354 may then be removed using an anisotrophic dry etch such as, for example, RIE, thereby leaving the first SIT spacers 352 and the second SIT spacers 356 on the pad layer 340. Accordingly, in the present embodiment for each mandrel 350, there are two (2) first SIT spacers 352 and two (2) second SIT spacers 356 formed for a total of eight (8) SIT spacers (i.e., four (4) first SIT spacers 352 and four (4) second SIT spacers 354) formed in one SIT process but exemplary embodiments are limited thereto. Rather, in other embodiments more or less than two mandrels may be formed.

A pattern of the first SIT spacers 352 and the second SIT spacers 356 is revealed as a result of the above removal of the mandrels 350, and the mandrel SIT spacers 354, as shown in FIG. 23. The pattern of the first SIT spacer 352 and the second SIT spacer 356 is then used to transfer the pattern to the pad layer 340 and the bulk semiconductor substrate 303.

In the present exemplary embodiment shown in FIG. 24, the pad layer 340, once patterned, is referred to hereinafter as a patterned pad layer 341. In this example, the pattern of the first SIT spacers 352 and the second SIT spacers 356 is first transferred to the pad layer 340, forming the patterned pad layers 341. This step may be carried out using, for example, a RIE process.

The patterned pad layer 341 can then be used to pattern the bulk semiconductor substrate 303. Again, for example, a RIE process may be used to etch trenches 302 into the bulk semiconductor substrate 303, thereby defining a plurality of first precursor semiconductor fin structures 360 and a plurality of second precursor semiconductor fin structures 362. The first precursor semiconductor fin structures 362 each include a sequential stack of a semiconductor fin 310 that is integral with the bulk semiconductor substrate 303 (formed from patterning the bulk semiconductor substrate 303), a corresponding one of the patterned pad layers 341 and a corresponding of the first SIT spacers 352. The second precursor semiconductor fin structures 362 each include a sequential stack of a semiconductor fin 310 that is integral with the bulk semiconductor substrate 303 (formed from patterning the bulk semiconductor substrate 303), a corresponding one of the patterned pad layers 341 and a corresponding of the second SIT spacers 356.

The particular etch chemistry used can be varied for etching selectivity between the pad layer 340 and the bulk semiconductor substrate 303. Alternatively, as provided above, the use of a pad layer 340 in this process flow is optional. Thus, in the instance where a dielectric layer is not employed, the pattern of the first SIT spacer 352 and the second SIT spacer 356 is at this step transferred directly into the bulk semiconductor substrate 303 (e.g., using RIE).

Next, the first SIT spacers 352 and the second SIT spacers 354 can then be removed from the first precursor semiconductor fin structures 360 and the second precursor semiconductor fin structures 362 using an RIE process, and the patterned pad layers 341 of the first precursor semiconductor fin structures 360 and the second precursor semiconductor fin structures 362 can then be removed using an RIE process to thereby form the semiconductor structure 300 of FIG. 19.

As a result of forming four (4) SIT spacers (e.g., two (2) first SIT spacer 352 and two (2) second SIT spacers 356) per mandrel for a total of eight (8) SIT spacers (i.e. four (4) first SIT spacers 352 and four (4) second SIT spacers 356) using mandrel/SIT spacer process of the present embodiment, the fin density can be quadruple that of the original mandrel density. In particular, with methods of exemplary embodiments, the mandrel/SIT spacer process can be performed "X" times (with no limitation for the value of X) as one process on the same level as each other to end up with a fin density that is 2X of the original mandrel density to thereby provide semiconductor fins having a tight pitch by performing the mandrel/SIT spacer process in one step.

For example, using a single SIT process (e.g., one mandrel) in accordance with exemplary embodiments of the application, the semiconductor fins 310 may be formed with pitches in the range of, for example, 36 nm-60 nm. In addition, using a double SIT process (e.g., two mandrels) in accordance with exemplary embodiments of the application, the semiconductor fins 310 may be formed with pitches in the range of, for example, 16 nm-60 nm.

Moreover, a gate structure (not shown) may be formed over the semiconductor fins 310, and then a source region (not shown) and a drain region (not shown) may be, for example, epitaxially grown on exposed portions of the semiconductor fins. Further, the source region and drain region may be provided with a desired dopant to define a plurality of FinFETs by, for example, any other suitable method known in the art (e.g. ion implantation).

Now referring to FIGS. 25-26, a fourth embodiment of the present application, which is a slight modification of the third embodiment of the present application is described below. Elements in the present embodiment which are in common with elements in the third embodiment with be labeled in the specification and drawings in connection with the present embodiments with the same reference numeral as that element in the third embodiment.

Figure 25:
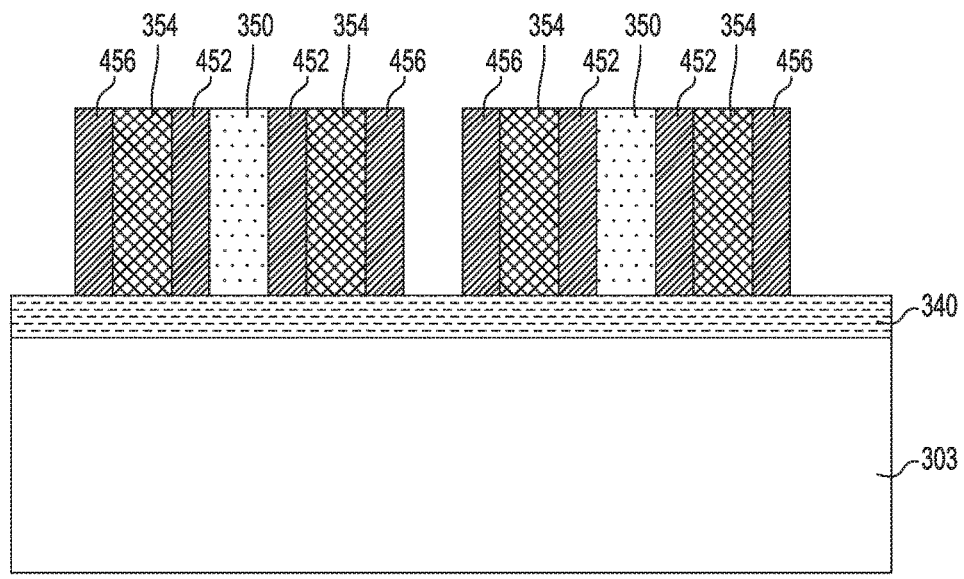
FIG. 25 is a vertical cross-sectional view of an exemplary semiconductor structure including a bulk semiconductor substrate, a pad layer disposed on the bulk semiconductor substrate, a plurality of mandrels disposed on the pad layer, and a first sidewall image transfer (SIT) spacer, a mandrel SIT spacer and a second SIT spacer sequentially formed on sidewalls of the mandrels according to a fourth embodiment of the application.

In particular, referring to FIG. 25, in the present embodiment, a pad layer 340 is first formed on a bulk semiconductor substrate 303, and then a plurality of mandrels 350 are formed on the pad layer 340 in the same manner as set forth above in connection with the third embodiment depicted in FIG. 20. Further, a first SIT spacer 452 is then formed on sidewalls of the mandrels 350, and a mandrel SIT spacer 354 is formed on sidewalls of the first SIT spacer 452. In addition, a second SIT spacer 456 is then formed on the sidewalls of the mandrel SIT spacers 354.

It is noted that the first SIT spacer 452, the mandrel SIT spacer 354 and the second SIT spacers 456 may be formed in essentially the same manner and using the same materials and processes as used for forming the first SIT spacer 352, the mandrel SIT spacer 354 and the second SIT spacer 356 in the third embodiment, except that in the present embodiment, the first SIT spacer 452 and the second SIT spacer 456 are formed of different materials from each other. For instance, in some embodiments, the first SIT spacer 452 is formed of oxide and the second SIT spacer 456 is formed of nitride. Alternatively, and in other embodiments, the first SIT spacer 452 is formed of nitride and the second SIT spacer 456 is formed of an oxide. Other than the above-mentioned difference, the third embodiment and the present embodiment are essentially the same as each other.

Figure 26:
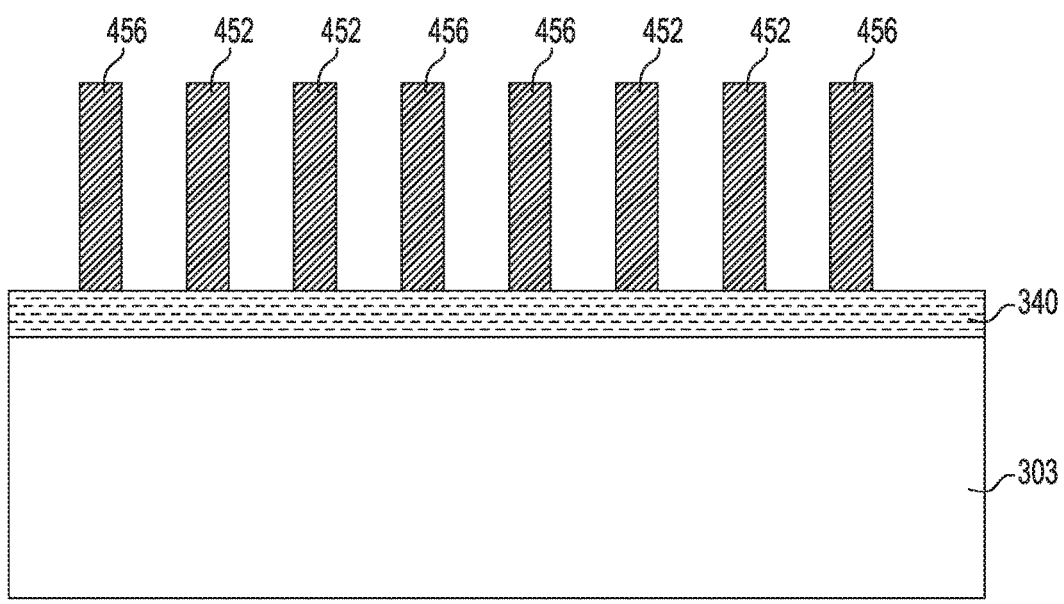
FIG. 26 is a vertical cross-sectional view of an exemplary semiconductor structure of FIG. 25 after removing the mandrel and the mandrel SIT spacers, thereby leaving a pattern of the first SIT spacers and the second SIT spacers on the pad layer.

Next, referring to FIG. 26, the mandrels 350 and the mandrel SIT spacer 354 may then be removed using an anisotrophic dry etch such as RIE, leaving the first SIT spacers 452 and the second SIT spacers 456. As discussed, the first SIT spacers 452 are formed of different materials than second SIT spacers 456, thereby leaving two sets of different spacers on the pad layer 340.

Further, a pattern of the first SIT spacer 452 and the second SIT spacer 456 may then be transferred to the pad layer 340 and the bulk semiconductor substrate 303 in essentially the same manner as discussed in connection with FIG. 24 of the third embodiment.

Lastly, the first SIT spacers 452 and the second SIT spacers 456, and patterned pad layer (not shown) can then be removed from each of a plurality of first precursor semiconductor fin structures (not shown) and a plurality of second precursor semiconductor fin structures (not shown) using, for example, an RIE process in similar fashion as discussed in connection with FIG. 24 of the third embodiment to thereby form a semiconductor structure which is similar to the semiconductor structure 300 of FIG. 19.

Moreover, a gate structure (not shown) may be formed over the semiconductor fins, and then a source region (not shown) and a drain region (not shown) may be epitaxially grown on exposed portions of the semiconductor fins. Further, the source region and drain region may be provided with a desired dopant to define a plurality of FinFETs by any suitable method known in the art (e.g. ion implantation).

With the above-mentioned methods of exemplary embodiments of the present application, semiconductor fins for FinFET devices may be formed with tight pitches. Moreover, unlike in the conventional art, with exemplary embodiments of the present application multiple mandrels may be formed on a same level of a wafer as each other in one step for performing a mandrel/SIT spacer process. On the contrary, the conventional art forms the mandrels on different levels of a wafer from one another which thereby increases the manufacturing costs associated therewith. Another drawback to conventional SIT2 processes is that they may encounter difficulties in cutting (removing) the unwanted semiconductor fins after SIT2 due to the tight fin pitch (semiconductor fins are closely spaced and therefore it is difficult to completely cut the unwanted fin without compromising the adjacent device semiconductor fins).

While the present application has been described in terms of specific embodiments, it is evident in view of the foregoing description that numerous alternatives, modifications and variations will be apparent to those skilled in the art. Each of the various embodiments of the present application can be implemented alone, or in combination with any other embodiments of the present application unless expressly disclosed otherwise or otherwise impossible as would be known to one of ordinary skill in the art. Accordingly, the present application is intended to encompass all such alternatives, modifications and variations which fall within the scope and spirit of the present application and the following claims.

What is claimed is:

1. A method for forming a semiconductor structure comprising:
   providing a semiconductor substrate;
   forming at least one mandrel on the semiconductor substrate;
   forming a first sidewall image transfer (SIT) spacer on opposing sidewalls of the at least one mandrel;
   forming, after the forming of the at least one mandrel and the first SIT spacer, a mandrel SIT spacer on a sidewall of each of the first SIT spacers, wherein the at least one mandrel and the mandrel SIT spacer have a same width and comprise a same mandrel material as each other, and the mandrel material is selected from the group consisting of polysilicon, amorphous silicon and amorphous carbon;
   forming a second SIT spacer having a sidewall directly contacting a sidewall of each of the mandrel SIT spacers, wherein the first and second SIT spacers comprise a spacer material that differs from the mandrel material and have a same width, wherein the width of the first and second SIT spacers is less than the width of the at least one mandrel and the mandrel SIT spacer;

removing, at the same time, the at least one mandrel and each of the mandrel SIT spacers from the sidewalls of the first and second SIT spacers, thereby defining a pattern comprising the first SIT spacers and the second SIT spacers on the semiconductor substrate; and etching the semiconductor substrate using the first SIT spacers and the second SIT spacers as an etching mask to transfer the pattern of the first SIT spacers and the second SIT spacers into the semiconductor substrate to form a plurality of semiconductor fins from the semiconductor substrate.

2. The method of claim 1, further comprising forming a pad layer on the semiconductor substrate prior to forming the at least one mandrel.

3. The method of claim 1, wherein the first SIT spacers and the second SIT spacers comprise a same spacer material as each other.

4. The method of claim 1, wherein the first SIT spacers comprise a first spacer material, and the second SIT spacers comprise a second spacer material that differs from the first spacer material.

5. The method of claim 1, wherein the semiconductor substrate is a bulk semiconductor substrate, and wherein the bulk semiconductor is etched using the first SIT spacers and the second SIT spacers as the etching mask to thereby form the plurality of trenches in the bulk semiconductor substrate, wherein the trenches define a plurality of semiconductor fins that are integral with the bulk semiconductor substrate.

6. The method of claim 1, wherein the at least one mandrel, the mandrel SIT spacer, the first SIT spacers and the second SIT spacers have topmost surfaces and bottommost surfaces that are coplanar with each other.

7. The method of claim 1, wherein the removing the at least one mandrel and the mandrel SIT spacers is utilizing an anisotropic etch.

8. The method of claim 1, further comprising removing the first and second SIT spacers from the semiconductor fins.

9. The method of claim 8, further comprising forming a field effect transistor on physically exposed surfaces of each semiconductor fin.

10. The method of claim 2, wherein prior to the etching the semiconductor substrate, the pad layer is etched utilizing the first SIT spacers and the second SIT spacers as an etching mask.

11. The method of claim 10, further comprising removing the first and second SIT spacers and remaining portions of the pad layer from the semiconductor fins.

12. The method of claim 11, further comprising forming a field effect transistor on physically exposed surfaces of each semiconductor fin.

* * * * *